United States Patent
Roh et al.

(10) Patent No.: US 11,664,400 B2
(45) Date of Patent: May 30, 2023

(54) IMAGE SENSOR AND ELECTRONIC APPARATUS INCLUDING THE SAME

(71) Applicant: SAMSUNG ELECTRONICS CO., LTD., Suwon-si (KR)

(72) Inventors: Sookyoung Roh, Yongin-si (KR); Seokho Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 58 days.

(21) Appl. No.: 17/078,918

(22) Filed: Oct. 23, 2020

(65) Prior Publication Data

US 2021/0126032 A1    Apr. 29, 2021

(30) Foreign Application Priority Data

Oct. 24, 2019 (KR) .................. 10-2019-0133274
Sep. 23, 2020 (KR) .................. 10-2020-0123318

(51) Int. Cl.
*H01L 27/146* (2006.01)
*H04N 23/67* (2023.01)

(52) U.S. Cl.
CPC .. *H01L 27/14625* (2013.01); *H01L 27/14603* (2013.01); *H01L 27/14621* (2013.01); *H04N 23/67* (2023.01)

(58) Field of Classification Search
CPC ......... H01L 27/14625; H01L 27/14603; H01L 27/14621; H01L 27/1462; H04N 5/23212; H04N 23/67
See application file for complete search history.

(56) References Cited

U.S. PATENT DOCUMENTS

| 7,741,664 | B2 | 6/2010 | Choi et al. |
| 9,653,501 | B2 | 5/2017 | Ungnapatanin et al. |
| 10,136,109 | B2 | 11/2018 | Yun et al. |
| 2013/0181114 | A1* | 7/2013 | Egawa ............. H01L 27/14629 257/E31.127 |
| 2014/0374574 | A1* | 12/2014 | Girard Desprolet ... G02B 5/204 359/891 |
| 2020/0096614 | A1* | 3/2020 | Amaya-Benitez ...... G01S 17/10 |

FOREIGN PATENT DOCUMENTS

| JP | 2007-184560 A | 7/2007 |
| KR | 10-2011-0052256 A | 5/2011 |
| KR | 10-2016-0004641 A | 1/2016 |

OTHER PUBLICATIONS

Xueming Li et al. "Stretchable Binary Fresnel Lens for Focus Training" Scientific Reports, vol. 6, 2016 (8 pages total).
Peng Wang et al. "Chromatic-aberration-corrected diffractive lenses for ultrabroadband focusing" Scientific Reports, vol. 6, 2016, (7 pages total).

\* cited by examiner

*Primary Examiner* — Ahmed A Berhan
(74) *Attorney, Agent, or Firm* — Sughrue Mion, PLLC

(57) ABSTRACT

Provided is an image sensor including a light sensor array including a plurality of light sensors configured to detect an incident light and convert the incident light into an electrical signal, the plurality of light sensors being are provided in a plurality of pixels, a transparent layer provided on the light sensor array, a color separation element provided on the transparent layer and configured to separate the incident light into light of a plurality of colors based on a wavelength band, and a focusing element including a nanostructure in a region corresponding to at least one pixel among the plurality of pixels and configured to perform auto focusing.

20 Claims, 30 Drawing Sheets

FIG. 6

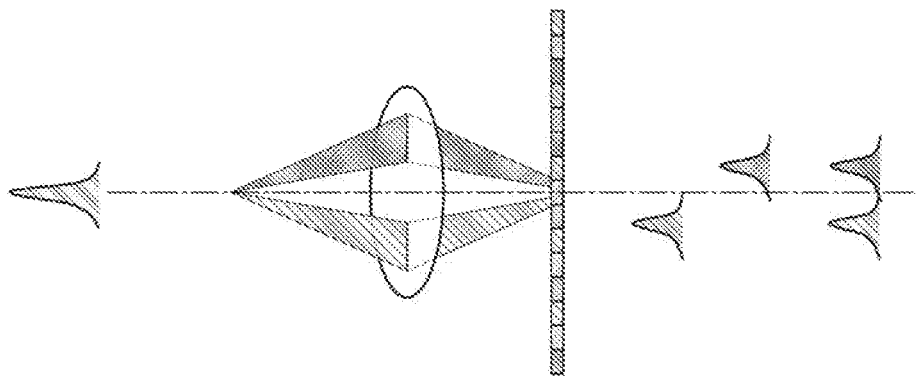
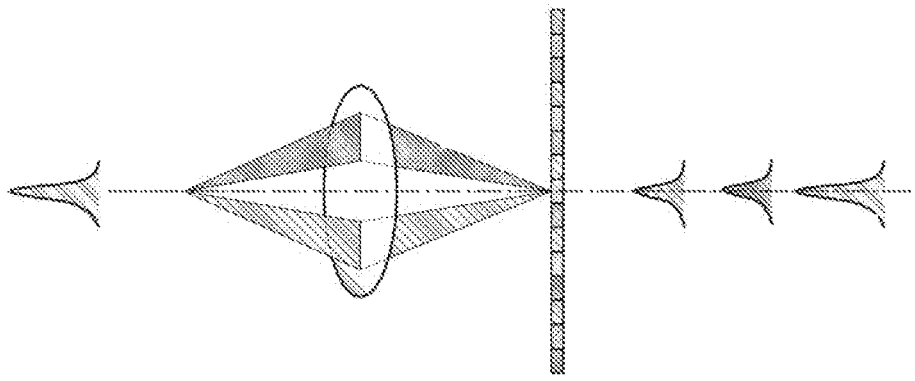
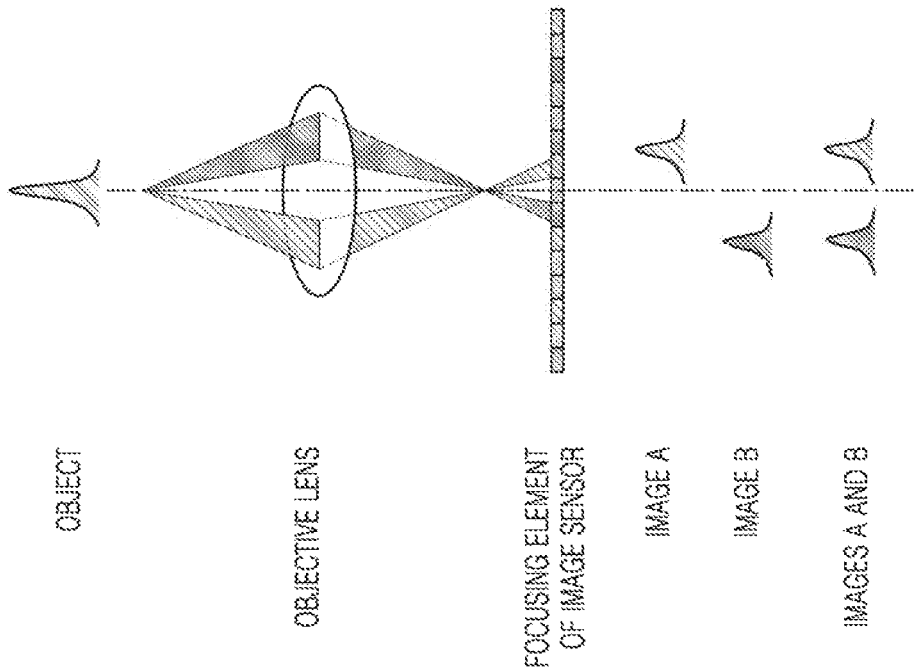

[Security]

IMAGE SENSOR AND ELECTRONIC APPARATUS INCLUDING THE SAME

CROSS-REFERENCE TO RELATED APPLICATIONS

This application claims priority from Korean Patent Application No. 10-2019-0133274, filed on Oct. 24, 2019 and Korean Patent Application No. 10-2020-0123318, filed on Sep. 23, 2020, in the Korean Intellectual Property Office, the disclosures of which are incorporated herein in their entireties by reference.

BACKGROUND

1. Field

Example embodiments of the present disclosure relate to an image sensor including a focusing element of a nanostructure and an electronic device including the same.

2. Description of Related Art

A color display apparatus or a color image sensor usually displays images of various colors or detects the color of incident light using a color filter. As the image sensor, for example, a charge-coupled device (CCD) and a CMOS may be used.

The color display apparatus or the color image sensor often adopts, for example, an RGB color filter method in which a green filter is disposed in two pixels among four pixels and a blue filter and a red filter are disposed in the remaining two pixels. In addition to the RGB color filter method, a CYGM color filter method in which color filters of cyan, yellow, green, and magenta, which are complementary colors, are respectively arranged in four pixels may be adopted. However, because the color filter absorbs light of colors other than the light of the corresponding color, the light utilization efficiency may decrease.

In addition, the color display apparatus or the color image sensor employs an auto focusing function to focus an image.

Auto focusing (AF) includes phase detection AF (PDAF) and contrast detection AF. PDAF divides light coming through a lens and sends the divided light to two or more AF sensors inside a camera. An AF sensor calculates how far apart these pieces of light are from each other on the AF sensor and moves the lens to adjust the distance of the two pieces of light to an optimal value and focus.

Contrast detection AF is to distinguish a contrast difference between objects and focus Contrast detection AF has the advantage of more accurate focusing than PDAF but is slower.

SUMMARY

One or more example embodiments provide an image sensor including a focusing element of a nanostructure.

One or more example embodiments also provide an electronic device including an image sensor including a focusing element of a nanostructure.

Additional aspects will be set forth in part in the description which follows and, in part, will be apparent from the description, or may be learned by practice of example embodiments of the disclosure.

According to an aspect of an example embodiment, there is provided an image sensor including a light sensor array including a plurality of light sensors configured to detect an incident light and convert the incident light into an electrical signal, the plurality of light sensors being provided in a plurality of pixels, a transparent layer provided on the light sensor array, a color separation element provided on the transparent layer and configured to separate the incident light into light of a plurality of colors based on a wavelength band, and a focusing element including a nanostructure in a region corresponding to at least one pixel among the plurality of pixels and configured to perform auto focusing.

The focusing element may be provided on a same layer as the color separation element.

An upper surface of the focusing element and an upper surface of the color separation element may be on a same plane.

The focusing element may include a binary lens structure.

The nanostructure included in the focusing element may be provided in concentric circles.

The nanostructure of the focusing element may have a shape dimension of a sub wavelength of the incident light.

The focusing element may be provided in a 2×2 pixel and the 2×2 pixel and includes a region corresponding to a red pixel, a blue pixel, a first green pixel, and a second green pixel, and a focusing image may be extracted at a position corresponding to the first green pixel and the second green pixel The color separation element may include the nanostructure having a shape dimension of a sub wavelength of the light.

The image sensor may include a plurality of regions configured to receive the incident light having different incidence angles, and a position of the focusing element provided in a corresponding pixel may be different based on the plurality of regions.

The plurality of regions may include a center region of the image sensor and a peripheral region of the image sensor, the focusing element may be provided at a center of the corresponding pixel in the center region, and the focusing element is shifted and provided at the center of the corresponding pixel in the peripheral region.

The color separation element may include a first nanostructure layer and a second nanostructure layer that is provided on an upper portion of the first nanostructure layer, and the focusing element may be provided on a same layer as the second nanostructure layer.

According to another aspect of an example embodiment, there is provided an electronic device including an objective lens, and an image sensor configured to generate an image of light incident through the objective lens, wherein the image sensor includes a light sensor array including a plurality of light sensors configured to detect an incident light and convert the incident light into an electrical signal, the plurality of light sensors being are provided in a plurality of pixels, a transparent layer provided on the light sensor array, a color separation element provided on the transparent layer and configured to separate the incident light into light of a plurality of colors based on a wavelength band, and a focusing element including a nanostructure in a region corresponding to at least one pixel among the plurality of pixels and configured to perform auto focusing.

The focusing element may be provided on a same layer as the color separation element.

An upper surface of the focusing element and an upper surface of the color separation element may be on a same plane.

The focusing element may include a binary lens structure.

The nanostructure of the focusing element may be provided in concentric circles.

The nanostructure of the focusing element may have a shape dimension of a sub wavelength of the incident light.

The focusing element may be provided in a 2×2 pixel and the 2×2 pixel and includes a region corresponding to a red pixel, a blue pixel, a first green pixel, and a second green pixel, and a focusing image may be extracted at a position corresponding to the first green pixel and the second green pixel The image sensor may include a plurality of regions configured to receive the incident light having different incidence angles, and a position of the focusing element provided in a corresponding pixel may be different based on the plurality of regions.

The plurality of regions may include a center region of the image sensor and a peripheral region of the image sensor, the focusing element may be provided at a center of the corresponding pixel in the center region, and the focusing element is shifted and provided at the center of the corresponding pixel in the peripheral region

BRIEF DESCRIPTION OF THE DRAWINGS

The above and/or other aspects, features, and advantages of example embodiments of the disclosure will be more apparent from the following description taken in conjunction with the accompanying drawings, in which:

FIGS. 3, 4, 5, 6, and 7 illustrate examples of the arrangement relationship between the pixel array of an image sensor and a focusing element according to example embodiments;

FIGS. 23A, 23B, and 23C are diagrams for explaining an auto focusing (AF) operation of an image sensor according to an example embodiment;

DETAILED DESCRIPTION

Figure 1:
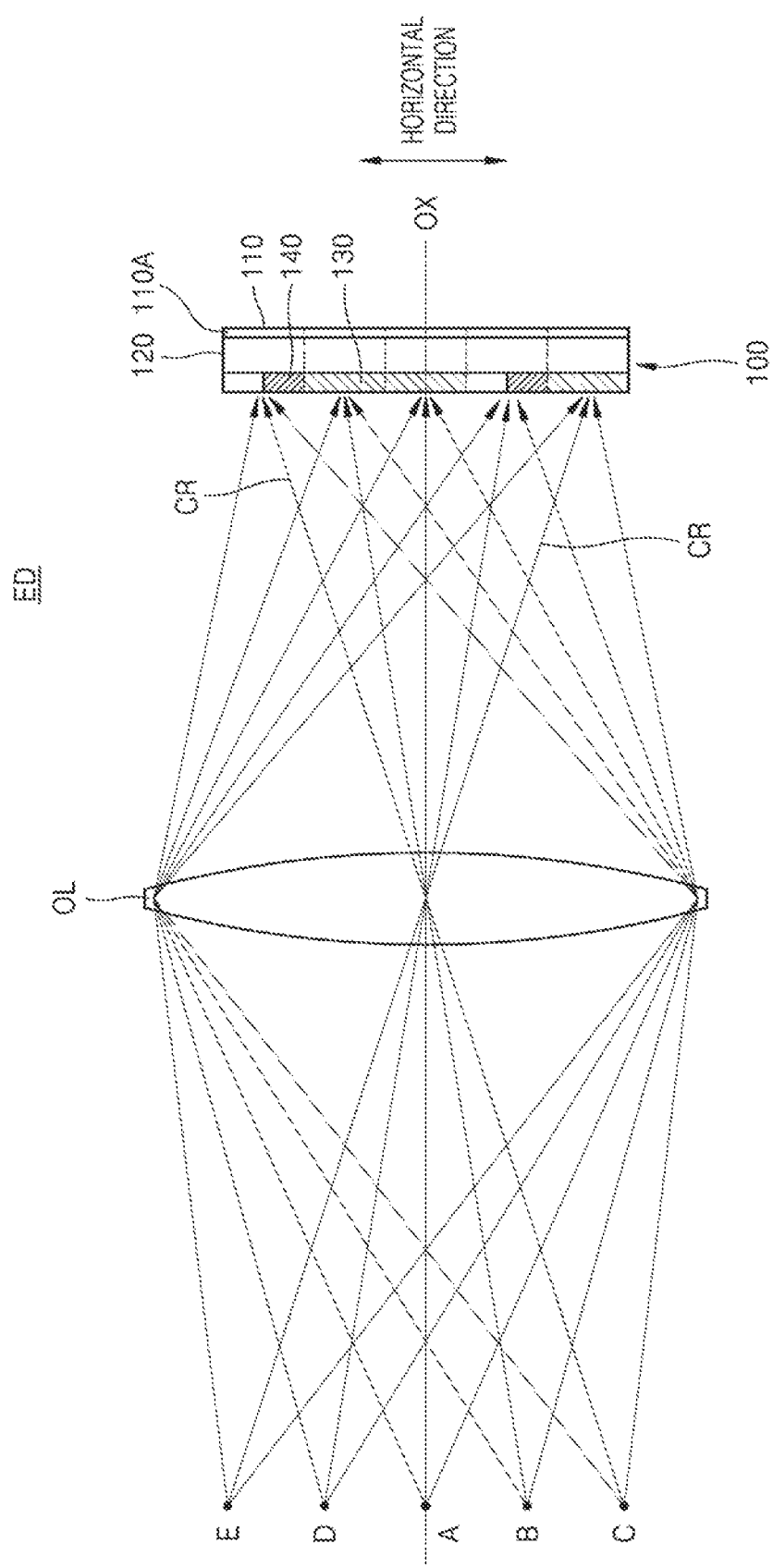
FIG. 1 schematically illustrates an electronic device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

An image sensor and an electronic device including the image sensor according to various example embodiments are described in detail with reference to the accompanying drawings. The size of each layer illustrated in the drawings may be exaggerated for convenience of explanation and clarity. Terms such as "first" and "second" are used herein merely to describe a variety of constituent elements, but the constituent elements are not limited by the terms. Such terms are used only for the purpose of distinguishing one constituent element from another constituent element.

Throughout the specification, when a portion "includes" an element, another element may be further included, rather than excluding the existence of the other element, unless otherwise described. Also, the size or the thickness of each layer illustrated in the drawings may be exaggerated for clarity of explanation. Also, in the following description, when a material layer is described to exist on another layer, the material layer may exist directly on the other layer or a third layer may be interposed therebetween. Since a material forming each layer in the following example embodiments is exemplary, other materials may be used therefor.

Terms such as a "portion", a "unit", a "module", and a "block" stated in the specification may signify a unit to process at least one function or operation and the unit may be embodied by hardware, software, or a combination of hardware and software.

The particular implementations shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of terms "a" and "an" and "the" and similar referents in the context of describing the disclosure are to be construed to cover both the singular and the plural.

The steps of all methods described herein can be performed in any suitable order unless otherwise indicated herein or otherwise clearly contradicted by context. The use of any and all examples, or language (e.g., "such as") provided herein, is intended merely to better illuminate the disclosure and does not pose a limitation on the scope of the disclosure unless otherwise claimed.

FIG. 1 schematically illustrates an electronic device ED according to an example embodiment. Referring to FIG. 1, the electronic device ED according to an example embodiment may include an objective lens OL and an image sensor 100 that converts light focused by the objective lens OL into an electrical image signal. The image sensor 100 may include a light sensor array 110A in which a plurality of light sensors 110 that detect incident light and convert the incident light into an electrical signal are arranged in a plurality of pixels, a spacer layer 120 provided in the light sensor array 110A, a color separation element 130 that is provided in the spacer layer 120 and separates the incident light into a plurality of pieces of pieces of color lights according to a wavelength band, and a focusing element 140 provided in a region corresponding to at least one pixel.

The light sensor 110 may be provided, for example, in at least one pixel unit. A pixel may represent a unit capable of sensing light for each wavelength and electrically processing an amount of the light. For convenience of description, the color separation element 130 and the focusing element 140 are simply illustrated in FIG. 1.

The plurality of color separation elements 130 may be provided in the spacer layer 120. The spacer layer 120 may include a material having a property of transmitting light. For example, the spacer layer 120 may include a material having a low refractive index and a low light absorption. For example, the spacer layer 120 may include a transparent dielectric material, but is not limited thereto.

The focusing element 140 may include a nanostructure to perform auto focusing (AF). The focusing element 140 may be provided on the same layer as the color separation element 130.

The objective lens OL may focus an image of an object on the image sensor 100. When the image sensor 100 is positioned on the focal plane of the objective lens OL, light being emitted from one point of the object may be collected again through the objective lens OL to one point of the image sensor 100. For example, the light being emitted at any point A on a light axis OX may pass through the objective lens OL and then may be collected at the center of the image sensor 100 on the light axis OX. In addition, the light starting at any point B, C, D, or E that deviates from the light axis OX may cross over the light axis OX by the objective lens OL and may be collected at one point of the periphery of the image sensor 100. For example, light starting at the point D above the light axis OX may be collected at the lower edge of the image sensor 100 across the light axis OX and light starting at the point C below the light axis OX may be collected at the upper edge of the image sensor 100 across the light axis OX. In addition, light starting at the point D located between the light axis OX and the point E may be collected between the center and the lower edge of the image sensor 100.

Accordingly, the light being emitted from each of the different points A, B, C, D and E may be incident on the image sensor 100 at a different angle according to the distance between each of the points A, B, C, D and E and the light axis OX. The incidence angle of the light incident on the image sensor 100 may be usually defined as a chief ray angle (CRA). A chief ray (CR) may refer to a ray incident to the image sensor 100 from a point of the object passing through the center of the objective lens OL, and the CRA may refer to an angle formed by the CR with the light axis OX. The light starting at the point A on the light axis OX may have a CRA of 0 degrees and may be incident perpendicularly to a region AA of the image sensor 100. As the light emission point moves away from the light axis OX, the CRA may increase.

From the perspective of the image sensor 100, the CRA of the light incident on the central region of the image sensor 100 is 0 degrees, and the CRA of the incident light increases toward the edge of the image sensor 100. For example, the CRA of the light starting from the points C and E and incident on regions of both edges of the image sensor 100 may be the largest. The CRA of the light starting from the points B and D and incident on a region between the center and the edge of the image sensor 100 may be less than the CRA in regions CC and EE and is larger than 0 degrees. In the example embodiment, the CRA may be used as the same as the incidence angle, and the incidence angle may represent an angle between a normal line and a light ray with respect to the incident surface. Hereinafter, the CRA will be referred to collectively as the incidence angle.

The plurality of color separation elements 130 may be disposed on the light incident side of the light sensor array 110A to separate the incident light according to a wavelength. The color separation element 130 may be used to increase the light distribution efficiency by separating the spectral distribution of the light incident on each light sensor 110 in accordance with the corresponding pixel.

In FIG. 1, a horizontal direction may indicate a horizontal direction in view of a user when the user uses the electronic device ED.

Figure 2:
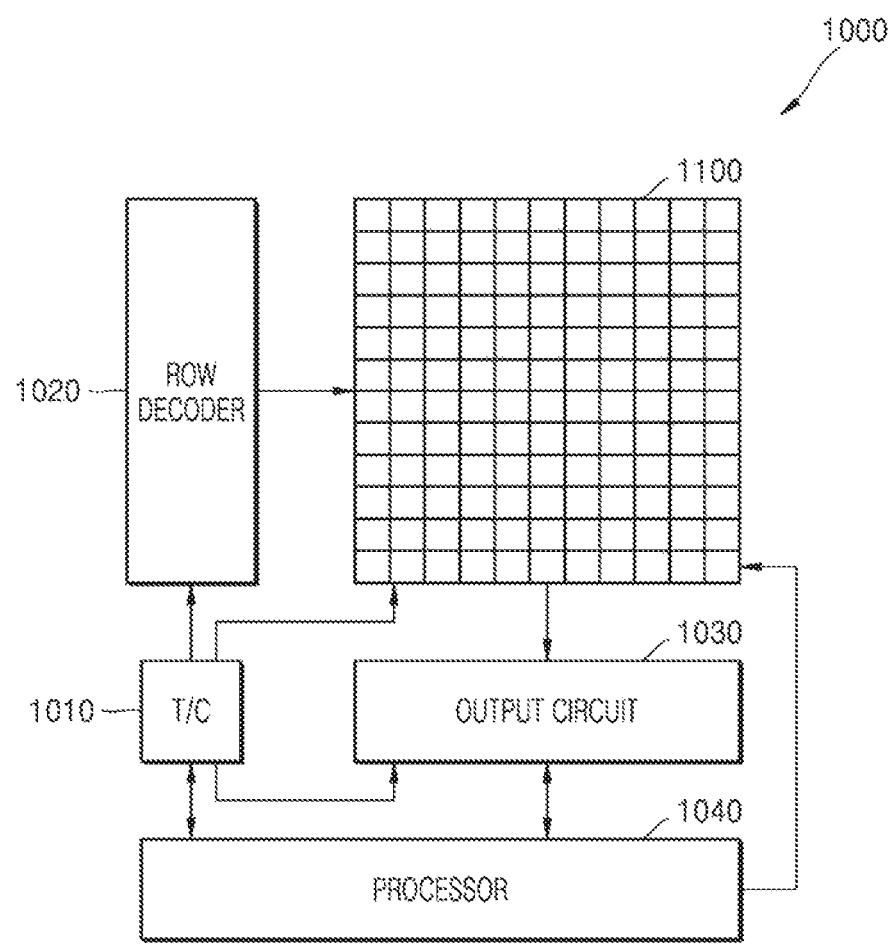
FIG. 2 is a schematic block diagram of an image sensor according to an example embodiment.

FIG. 2 is a schematic block diagram of an image sensor 1000 according to an example embodiment. Referring to FIG. 2, the image sensor 1000 according to an example embodiment may schematically include a pixel array 1100, a timing controller 1010, a row decoder 1020, and an output circuit 1030. The image sensor 1000 may further include a processor 1040 that controls the pixel array 1100, the timing controller 1010, and the output circuit 1030, and may process an image signal output through the output circuit 1030. The image sensor according to an example embodiment may be a charge coupled device (CCD) image sensor or a complementary metal oxide semiconductor (CMOS) image sensor.

The pixel array 1100 may include a plurality of pixels arranged two dimensionally along a plurality of rows and a plurality of columns. The row decoder 1020 may select any one of the plurality of rows of the pixel array 1100 in response to a row address signal output from the timing controller 1010. The output circuit 1030 may output a light sensing signal in a column unit from a plurality of pixels arranged along the selected row. To this end, the output circuit 1030 may include a column decoder and an analog to digital converter (ADC). For example, the output circuit 1030 may include a plurality of ADCs arranged for each column between the column decoder and the pixel array 1100. The output circuit 1030 may include one ADC disposed in an output terminal of the column decoder. According to an example embodiment, the timing controller 1010, the row decoder 1020, and the output circuit 1030 may be implemented as a single chip, or may be implemented as separate chips. A processor that may process the image signal output through the output circuit 1030 may be implemented as a single chip together with the timing controller 1010, the row decoder 1020, and the output circuit 1030.

The pixel array 1100 may include a plurality of pixels sensing light of different wavelengths. An arrangement of the plurality of pixels sensing the light of different wavelengths may be implemented in various ways.

Figure 3:
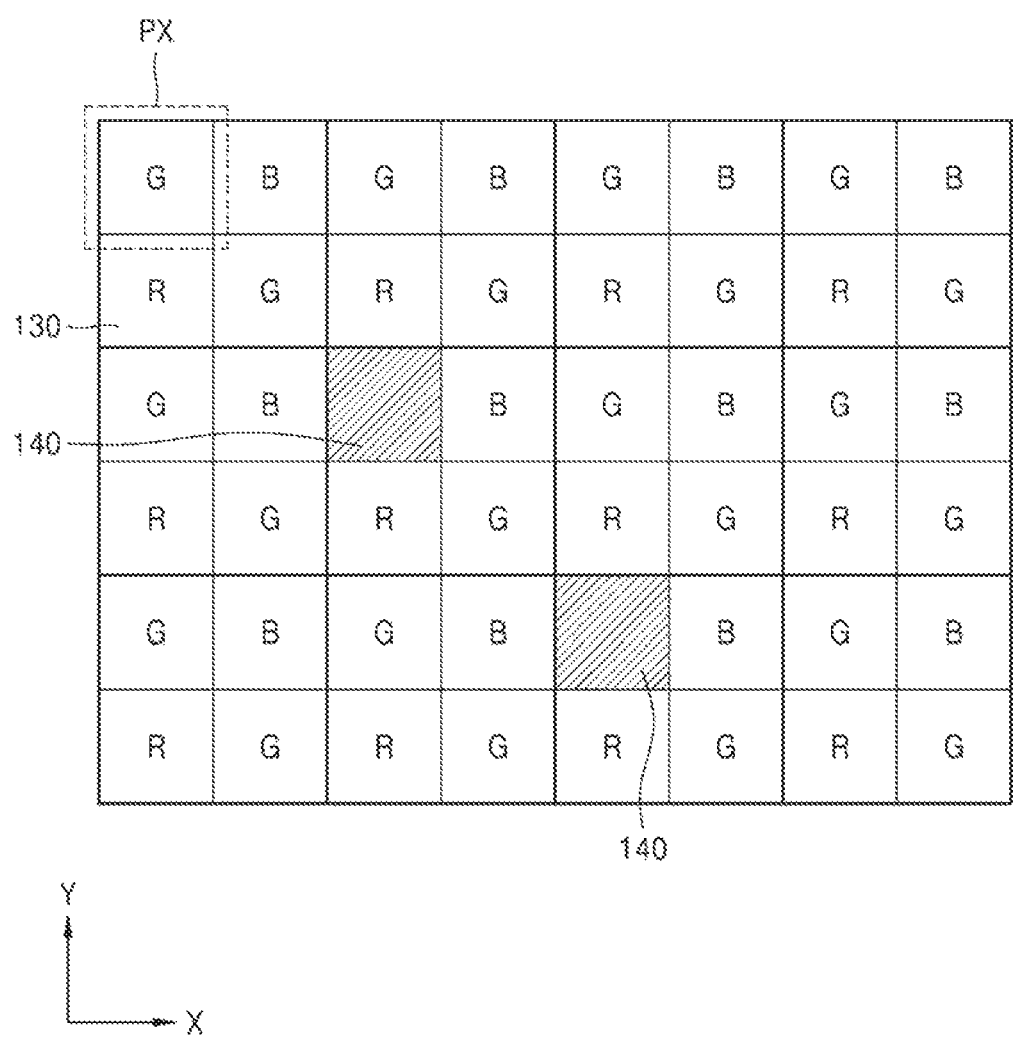

FIG. 3 illustrates an example of the pixel array of an image sensor. The pixel array of the image sensor may be an array of Bayer patterns. A pixel PX may represent a unit configured to sense light for each wavelength and electrically process an amount of light. The image sensor may include, for example, a blue pixel B, a green pixel G, a red pixel R, and a green pixel G. Such a pixel array may be repeatedly arranged two-dimensionally in a first direction (X direction) and a second direction (Y direction).

The color separation element 130 may be disposed in the plurality of pixels PX, and the focusing element 140 may be disposed in at least one pixel PX. The focusing element 140 may be disposed in some pixels PX as necessary. The color separation element 130 and the focusing element 140 may be provided on the same layer.

Figure 4:
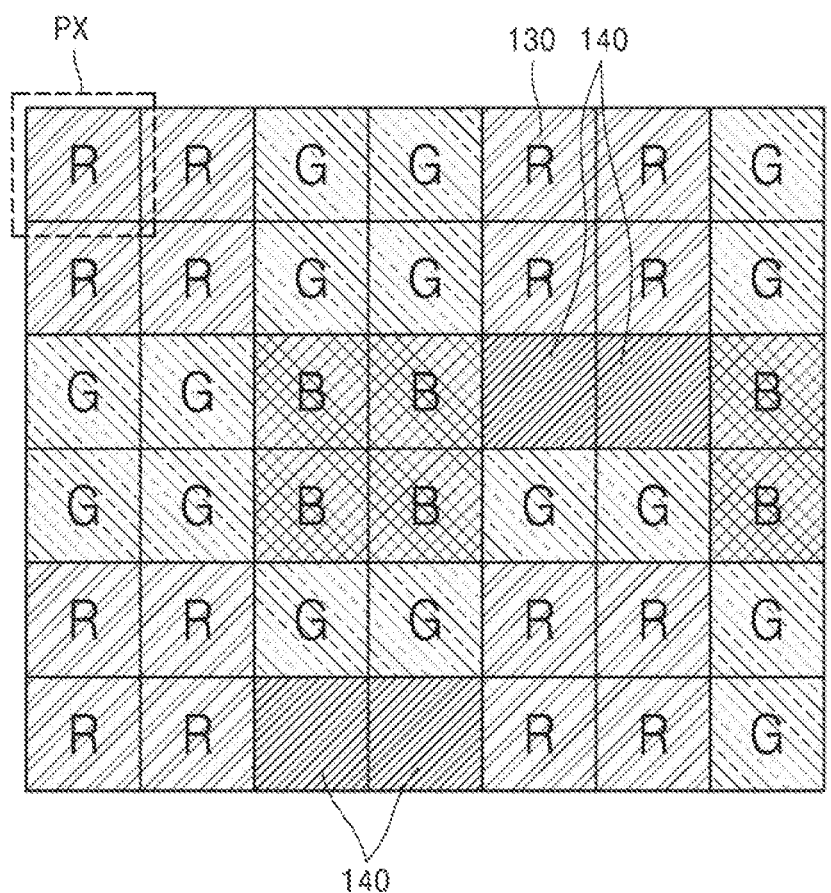

FIG. 4 illustrates another pixel array. For example, the image sensor may be configured to correspond to one color for every four neighboring pixels PX, and the four pixel units may be repeatedly arranged. For example, four red pixels R and four blue pixels B may be disposed in a diagonal direction, and four green pixels G and four green pixels G may be disposed in a diagonal direction. The focusing element 140 may be provided in two pixel regions between the pixel arrays. In addition, the color separation element 130 may be provided in the remaining two pixel regions. In the example embodiment, the focusing element 140 may be provided in a region corresponding to the two green pixels G.

Figure 5:
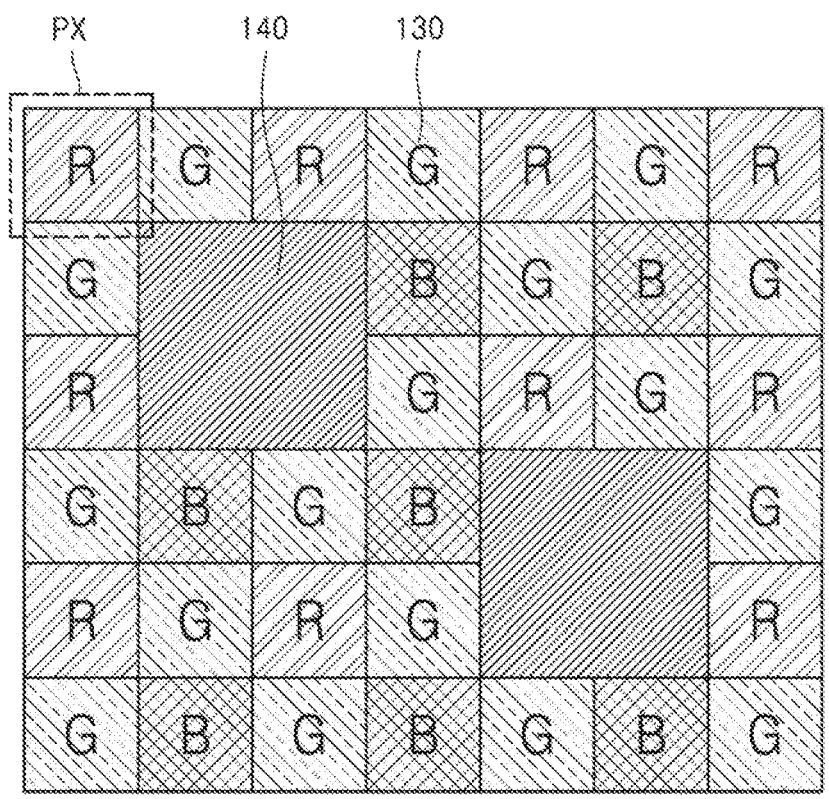

FIG. 5 illustrates an example in which a pixel has an arrangement of Bayer patterns as shown in FIG. 3. The focusing element 140 may be provided in a region corresponding to four pixels in a pixel array. The focusing element 140 may be disposed in a 2×2 pixel region, and the 2×2 pixel region may be a region corresponding to the red pixel R, the blue pixel B, and first and second green pixels G. The focusing element 140 may be configured to extract a focusing image in this region.

Figure 6:
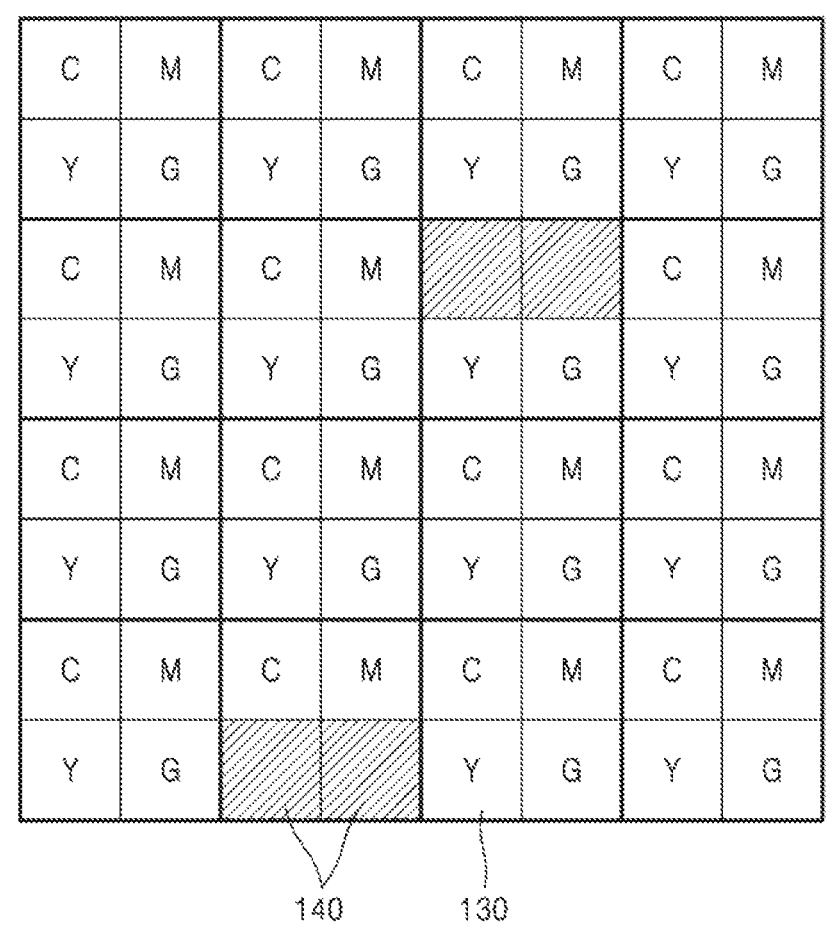

Referring to FIG. 6, for example, the pixel may have a CYGM arrangement in which a magenta pixel M, a cyan pixel C, a yellow pixel Y, and a green pixel G constitute one unit pixel according to an example embodiment. The focusing element 140 may be provided in, for example, two pixel regions of a 2×2 pixel region.

Figure 7:
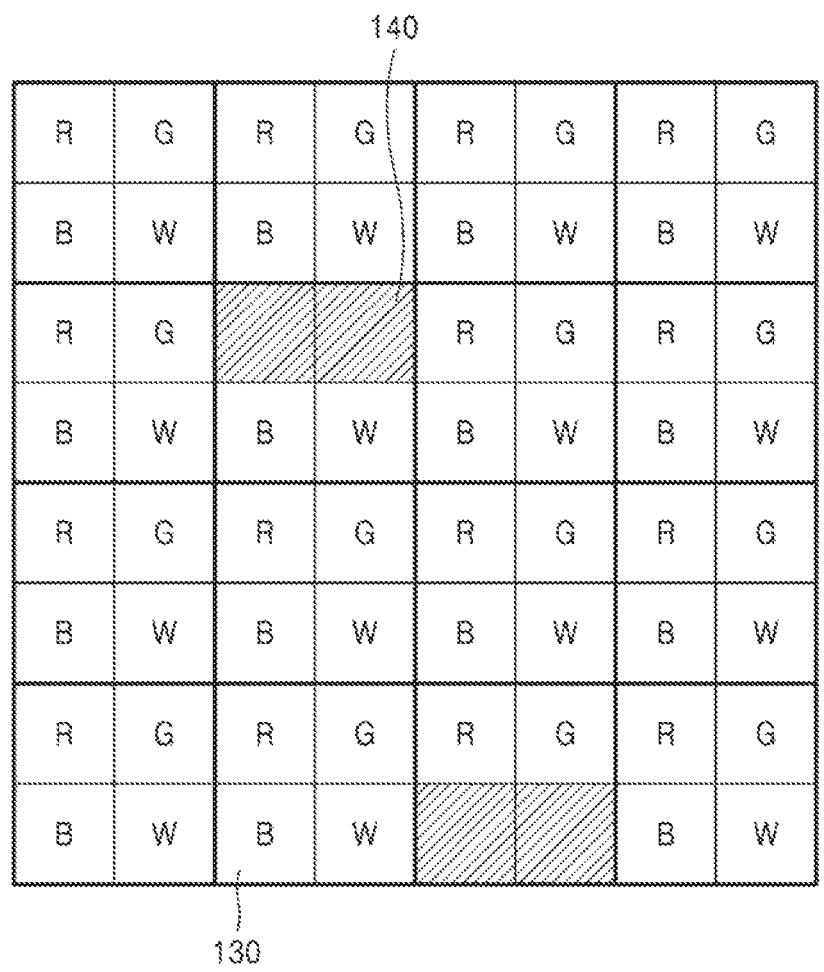
Figure 8:
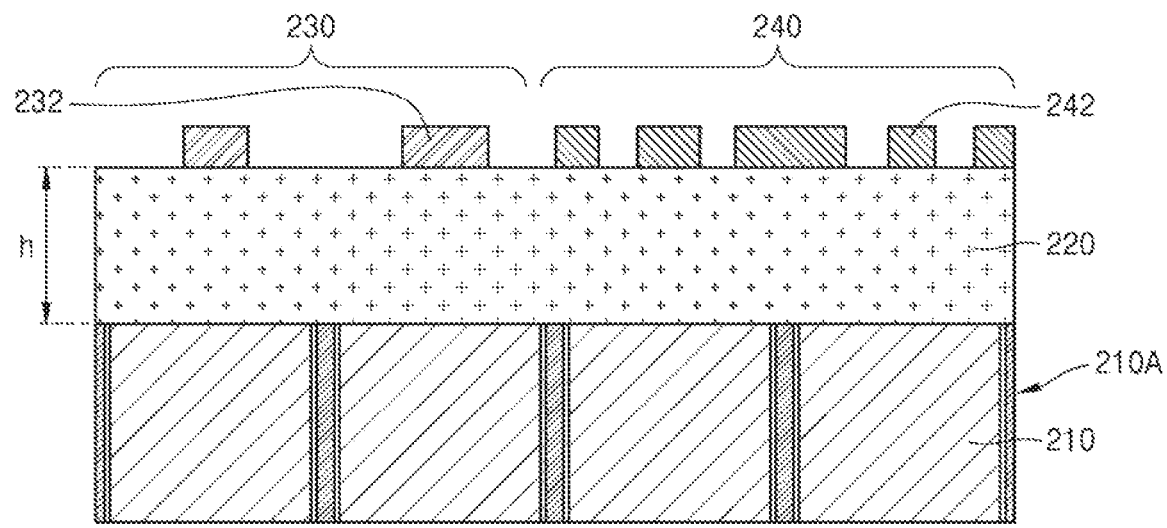
FIG. 8 illustrates a layer structure of an image sensor according to an example embodiment.

In addition, referring to FIG. 7, the pixel may have an RGBW arrangement in which a green pixel G, a red pixel R, a blue pixel B, and a white pixel W constitute one unit pixel according to an example embodiment. The focusing element 140 may be provided in, for example, a region corresponding to the red pixel R and a region corresponding to the green pixel G, or may be provided in a region corresponding to the blue pixel B and a region corresponding to the white pixel W. The unit pixel may be in the form of a 3×2 array. In addition, pixels of the pixel array 1100 may be arranged in various ways according to the color characteristics of the image sensor 1000. Hereinafter, for convenience, the pixel array 1100 of the image sensor 1000 may have a Bayer pattern, but example embodiments described below may be applied to a pixel arrangement other than the Bayer pattern FIG. 8 illustrates an image sensor according to an example embodiment.

The image sensor may include a light sensor array 210A in which a plurality of light sensors 210 are arranged, a spacer layer 220 provided in the light sensor array 210A, and a color separation element 230 and a focusing element 240 provided in the spacer layer 220. The light sensor 210 may detect incident light and convert the incident light into an electrical signal. The light sensor 210 may be, for example, a photodiode. The spacer layer 220 may be provided to maintain a predetermined distance between the light sensor array 210A and the color separation element 230 and the focusing element 240. A thickness h of the spacer layer 220 may depend on a wavelength $\lambda$ that is a branching target or the pixel size. The thickness h of the spacer layer 220 may be greater than the wavelength $\lambda$ that is the branching target. For example, the thickness h of the spacer layer 220 may be greater than the center wavelength $\lambda$ of a visible light wavelength band. The thickness h of the spacer layer 220 may be $1\lambda$ or more. The thickness h of the spacer layer 220 may depend on an arrangement period p of the light sensor 210. The period p may be a distance between centers of adjacent light sensors. The thickness h of the spacer layer 220 may be in the range of, for example, 1p to 3p. The thickness h of the spacer layer 220 may be in the range of, for example, 500 nm to 5 µm.

The color separation element 230 and the focusing element 240 may be provided on the same layer. The color separation element 230 may include, for example, nanostructures 232 arranged according to certain rules. Here, a rule is applied to parameters such as the shape, size (width and height), interval, arrangement shape, etc. of the nanostructure 232. These parameters may be determined according to a target phase distribution that the nanostructure 232 is to implement with respect to the incident light. The target phase distribution may be determined considering a target region to be focused by separating the wavelength of the incident light. The nanostructure 232 may have the shape dimension of a sub wavelength of light.

The focusing element 240 may include a nanostructure 242. The nanostructure 242 may have, for example, a shape dimension of the sub wavelength of light. The focusing element 240 may have, for example, a binary lens structure. The focusing element 240 may have a structure in which the nanostructures 242 are arranged in the form of a concentric circle. The focusing element 240 may have a flat lens structure. The flat lens structure may be a structure in which an upper surface is flat.

The upper surface of the focusing element 240 and the upper surface of the color separation element 230 may be located on the same plane. When the upper surface of the focusing element 240 and the upper surface of the color separation element 230 are located on the same plane, a manufacturing process may be simplified to increase productivity, and light may be evenly distributed. However, the upper surface of the focusing element 240 and the upper surface of the color separation element 230 may be located at different heights. For example, when the upper surface of the focusing element 240 is located higher than the upper surface of the color separation element 230, a greater amount of light may be relatively incident on the focusing element 240 compared to the color separation element 230. Therefore, the height of the upper surface of the focusing element 240 and the upper surface of the color separation element 230 may be adjusted as necessary.

The light entering the color separation element 230 may be separated by the color separation element 230 according to the wavelength and may be incident on the light sensor 210 of the corresponding pixel region. The light entering the focusing element 240 may be separated into two pieces of light and extracted by the light sensor 210 into two focusing images. A degree of focusing may be detected using a phase difference between the two focusing images. AF may be performed by adjusting the position of the objective lens (OL of FIG. 1) according to the degree of focusing. This will be described later.

Figure 9:
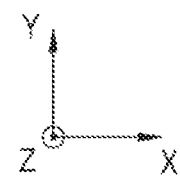
FIG. 9 is a schematic plan view of a light sensor array included in an image sensor according to an example embodiment.

FIG. 9 is a schematic plan view of the light sensor array 210A according to an example embodiment. Referring to FIG. 9, a first row in which a first light sensor 211 and a second light sensor 212 are alternately arranged, and a second row in which a third light sensor 213 and a fourth light sensor 214 are alternately arranged may be repeated alternately with each other. In the light sensor array 210A, the plurality of first light sensor 211, second light sensor 212, third light sensor 213, and fourth light sensor 214 may be two-dimensionally arranged in a first direction (X direction) and in a second direction (Y direction). For example, referring to FIGS. 3 and 9, the first light sensor 211 and the fourth light sensor 214 may correspond to the green pixel G, the second light sensor 212 may correspond to the blue pixel B, and the third light sensor 213 may correspond to the red pixel R.

The arrangement rule of the color separation element 230 is an example of implementing a target phase distribution in which light having a first wavelength is branched and condensed to the first light sensor 211 and the fourth light sensor 214, light having a second wavelength is branched and condensed to the second light sensor 212, and light having a third wavelength is branched and condensed to the third light sensor 213. However, embodiments are not limited thereto.

Figure 10:
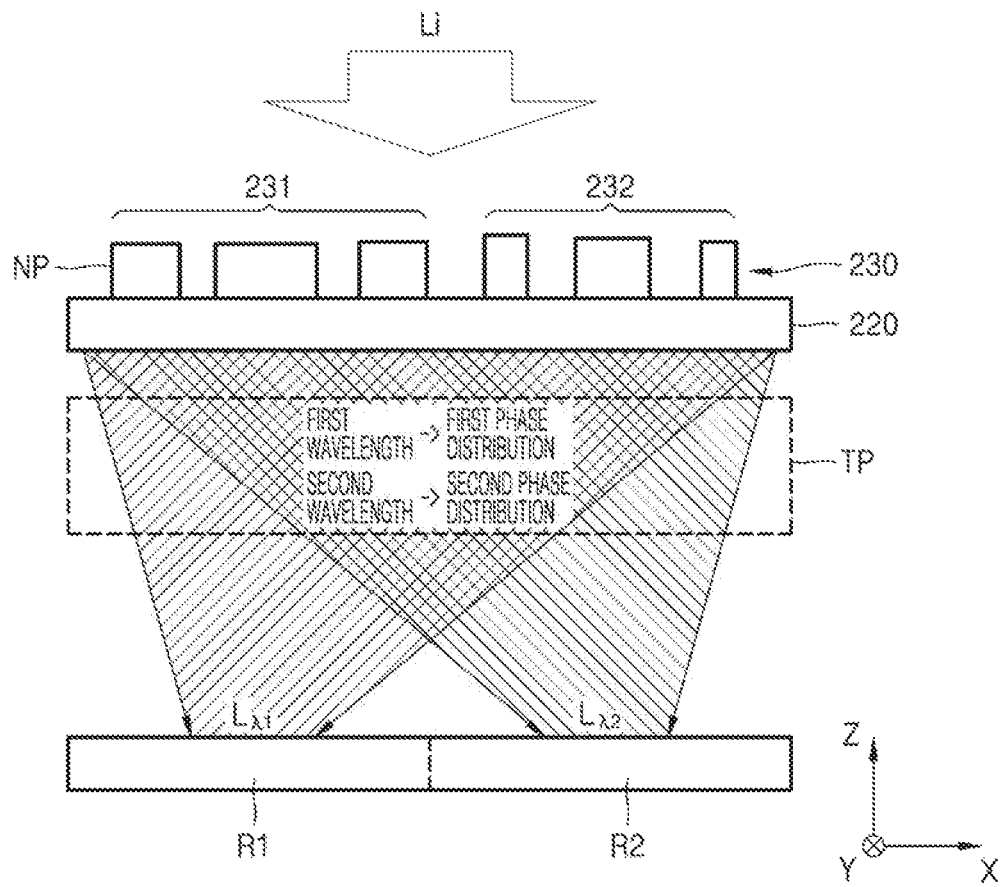
FIG. 10 schematically illustrates a color separation element included in an image sensor according to an example embodiment.

FIG. 10 is a conceptual diagram illustrating a schematic structure of the color separation element 230 according to an example embodiment.

The color separation element 230 may include a plurality of nanostructures, for example, nanoposts NP provided in the spacer layer 220. The plurality of nanoposts NP may be arranged according to a predetermined rule.

Here, the predetermined rule may be applied to parameters such as the shape, size (width and height), interval, arrangement shape, etc. of the nanopost NP, and these parameters may be determined according to a target phase distribution TP to be implemented by the nanopost NP with respect to incident light Li. The target phase distribution TP may be determined considering first target region R1 and second target region R2 to be focused by separating the wavelength of the incident light Li. Here, the first target region R1 and second target region R2 may be corresponding light sensor regions. Referring to FIG. 10, the target phase distribution TP is indicated between the color separation element 230 and the first target region R1 and second target region R2, but this is for convenience of illustration. The target phase distribution TP may be a phase distribution in a positon immediately after the incident light Li passes through the color separation element 230. The color separation element 230 may separate the incident light Li for each wavelength and adjust the phase distribution of light of each wavelength such that the separated light of each wavelength is condensed to each of the predetermined target regions R1 and R2.

The nanopost NP may include a material of a higher refractive index than a refractive index of material surrounding the nanopost NP, and the spacer layer 220 may include a material of a lower refractive index than than the refractive index of the nanopost NP.

The nanopost (NP) may include at least one of, for example, c-Si, p-Si, a-Si, and III-V compound semiconductors (gallium phosphide (GaP), gallium nitride (GaN), gallium arsenide (GaAs), etc.), silicon carbide (SiC), titanium oxide (TiO2), and silicon nitride (SiN). The spacer layer 120 may include any one of glass (fused silica, BK7, etc.), quartz, polymer (PMMA, SU-8, etc.), and plastic.

The nanopost NP having a refractive index that is different from the refractive index of the surrounding material may change the phase of light passing through the nanopost NP. This is due to a phase delay caused by the shape dimensions of sub-wavelengths of the nanoposts NP, and a degree to which the phase is delayed is determined by the detailed shape dimensions and arrangement shape of the nanoposts NP. The plurality of nanoposts NP may achieve various optical functions by appropriately setting the degree of phase delay that occurs in each of the nanoposts NP.

The color separation element 230 is for branching the incident light Li according to wavelengths and condensing the incident light Li to the different first target region R1 and second target region R2, and detailed rules of the nanopost NP may be determined according to the target phase distribution TP for implementing the incident light Li in a desired position.

The phase of a light L$\lambda$1 of a first wavelength $\lambda$1 in a position immediately after passing through the color separation element 230 may be $2N\pi$ (N is an integer greater than 0) in a region corresponding to the center of the first target region R1 and may be $(2N-1)\pi$(N is an integer greater than 0) in a region corresponding to the center of the second target region R2.

The phase of a light L$\lambda$2 of a second wavelength $\lambda$2 in a position immediately after passing through the color separation element 230 may be $2M\pi$ (M is an integer greater than 0) in the region corresponding to the center of the first target region R1 and may be $(2M-1)\pi$ (M is an integer greater than 0) in the region corresponding to the center of the second target region R2.

The first wavelength $\lambda$1 and the second wavelength $\lambda$2 may be visible light wavelength bands, but embodiments are not limited thereto, and various wavelength bands may be implemented according to an arrangement rule of the color separation element 230. In addition, although example embodiments illustrate that two wavelengths are branched and condensed, embodiments are not limited thereto, and incident light may be branched in three or more directions according to the wavelength to be branched.

The color separation element 230 may include a first region 231 and a second region 232 each including one or more nanoposts NP. The first region 231 and the second region 232 may be disposed to face the first target region R1 and the second target region R2, respectively, and may correspond one-to-one. Although it is shown that three nanoposts NP are disposed in each of the first region 231 and the second region 232, this is exemplary. In addition, according to an example embodiment, the nanopost NP may be entirely located within any one of the first region 231 and the second region 232, but embodiments are not limited thereto, and some of the nanoposts NP may be disposed in a boundary between the first region 231 and the second regions 232. For example, the color separation element 230 may be configured to focus a first wavelength light L$\lambda$1 of the incident light Li with a first phase distribution into the first target region R1. In addition, the color separation element 230 may be configured to focus the second wavelength light L$\lambda$2 of the incident light Li with a second phase distribution into the second target region R2.

Figure 11:
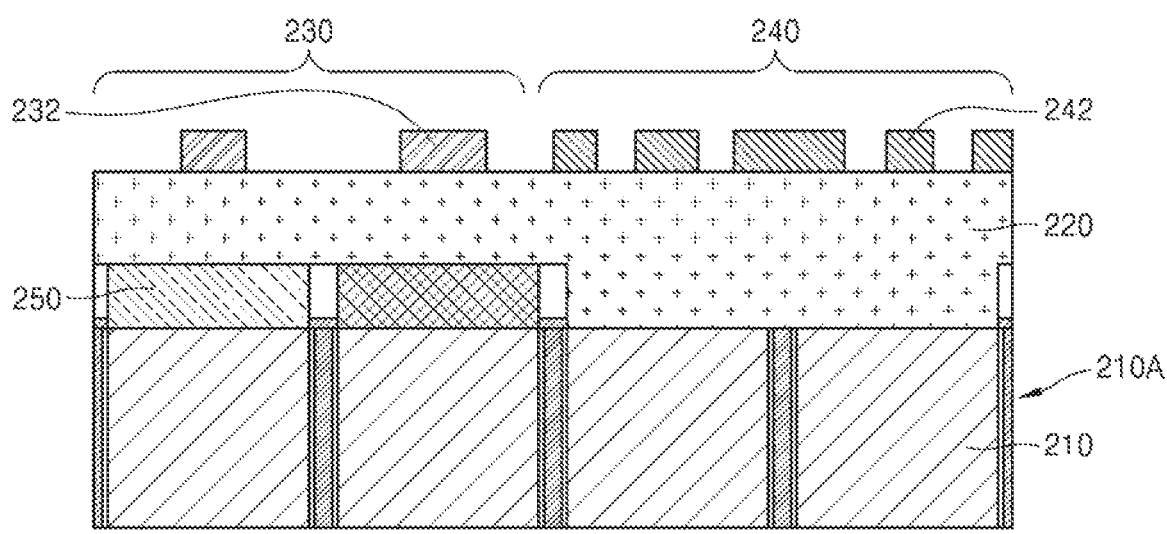
FIG. 11 illustrates an example in which the image sensor shown in FIG. 8 further includes a color filter according to an example embodiment.

FIG. 11 illustrates an example in which an image sensor further includes a color filter 250 when compared with FIG. 8. The color filter 250 may be provided between the light sensor 210 and the color separation element 230. The color filter 250 may be provided to further increase the color separation efficiency.

Figure 12:
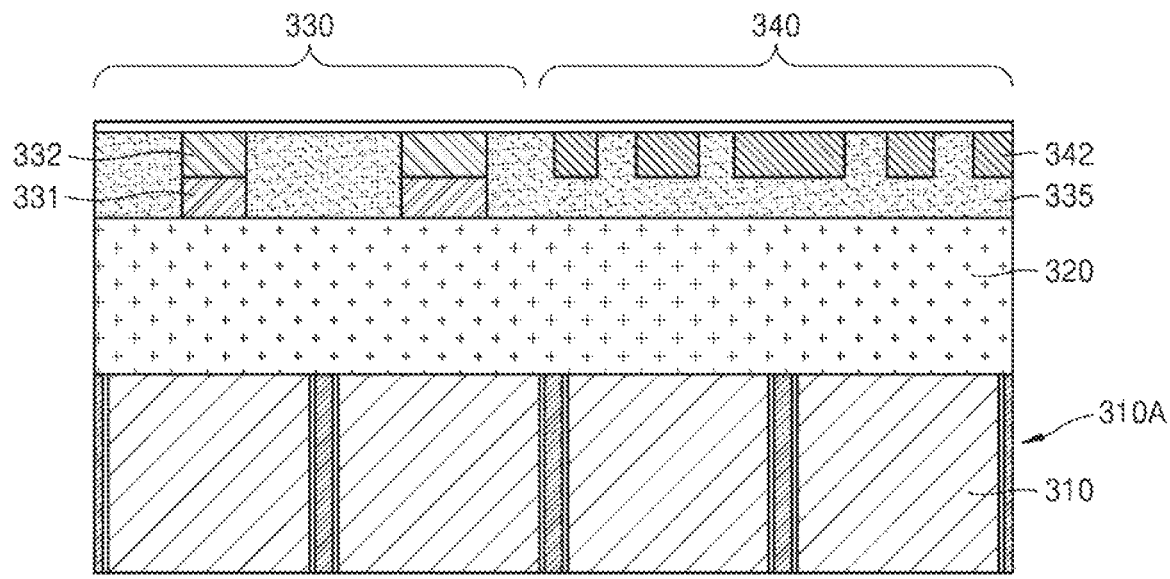
FIG. 12 illustrates a layer structure of an image sensor according to another example embodiment.

FIG. 12 illustrates an image sensor according to another example embodiment.

The image sensor may include a light sensor array 310A in which a plurality of light sensors 310 are arranged, a spacer layer 320 provided in the light sensor array 310A, and a color separation element 330 and a focusing element 340 provided in the spacer layer 320. The light sensor 310 may detect incident light and convert the incident light into an electrical signal. The light sensor 310 may be, for example, a photodiode. A support layer 335 may be provided on the spacer layer 320. The color separation element 330 and the focusing element 340 may be provided on the support layer 335. The support layer 335 may include the same material as the spacer layer 320. The color separation element 330 may include a first nanostructure layer 331 and a second nanostructure layer 332 provided on the first nanostructure layer 331. The focusing element 340 may include a nanostructure 342 provided in the same layer as the second nanostructure layer 332.

Although FIG. 12 illustrates the example in which the support layer 335 is provided on the spacer layer 320, the support layer 335 may be provided in the light sensor array 310A without the spacer layer 320, and the color separation element 330 and the focusing element 340 may be provided in the support layer 335.

Figure 13:
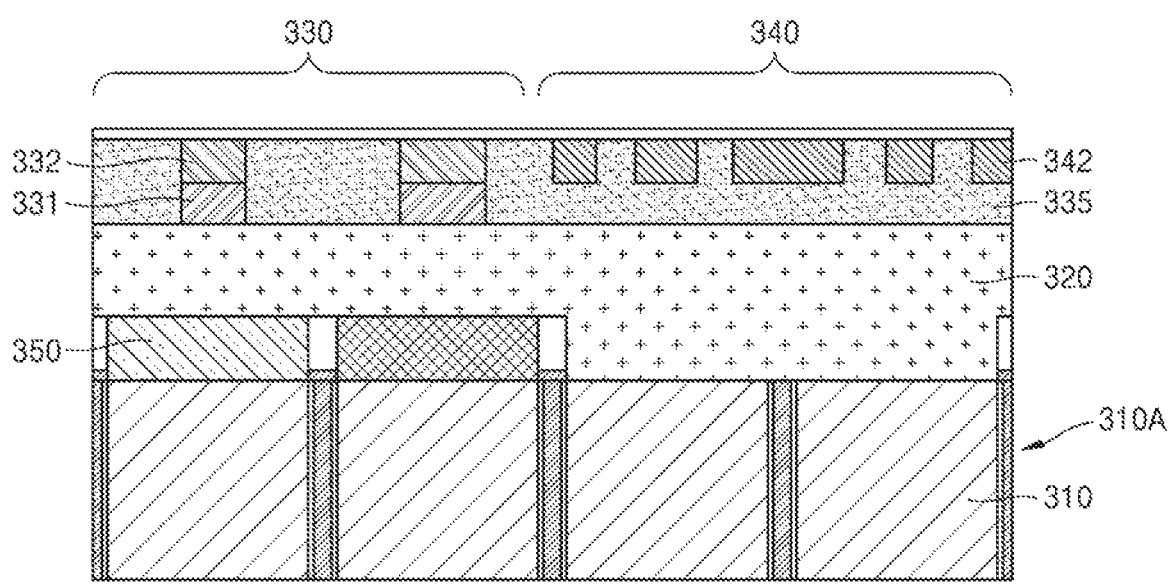
FIG. 13 illustrates an example in which the image sensor shown in FIG. 12 further includes a color filter according to an example embodiment.

FIG. 13 illustrates an example in which an image sensor further includes a color filter 350 when compared with FIG. 12. The color filter 350 may be provided between the light sensor 310 and the color separation element 330.

Figure 14:
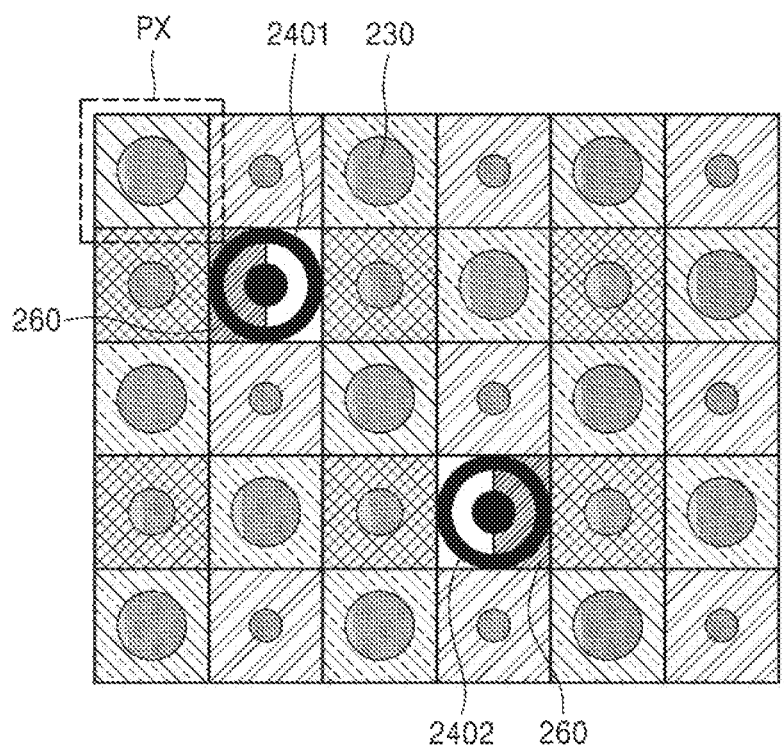
FIG. 14 illustrates an example in which a focusing element is provided in one pixel of an image sensor according to an example embodiment.

Referring to FIG. 14, each of first focusing element 2401 and the second focusing element 2402 may be provided in a region corresponding to one pixel PX. The first focusing element 2401 and the second focusing element 2402 may have a binary lens structure. When each of the first focusing element 2401 and the second focusing element 2402 is provided in one pixel PX, a shielding layer 260 may be provided at a lower portion of each of the first focusing element 2401 and the second focusing element 2402 for a focusing operation. The shielding layer 260 may reduce or prevent part of light that has passed through the first focusing element 2401 and the second focusing element 2402 from passing through.

A pair of the first focusing element 2401 and the second focusing element 2402 may operate. The shielding layer 260 of the first focusing element 2401 may be provided in the left half region of the pixel PX in the figure, and the shielding layer 260 of the second focusing element 2402 may be provided in the right half region of the pixel PX in the figure. Therefore, focusing images may be extracted by the light passing through the first focusing element 2401 and the light passing through the second focusing element 2402, and a phase difference between the two focusing images may be detected and focused.

Figure 15:
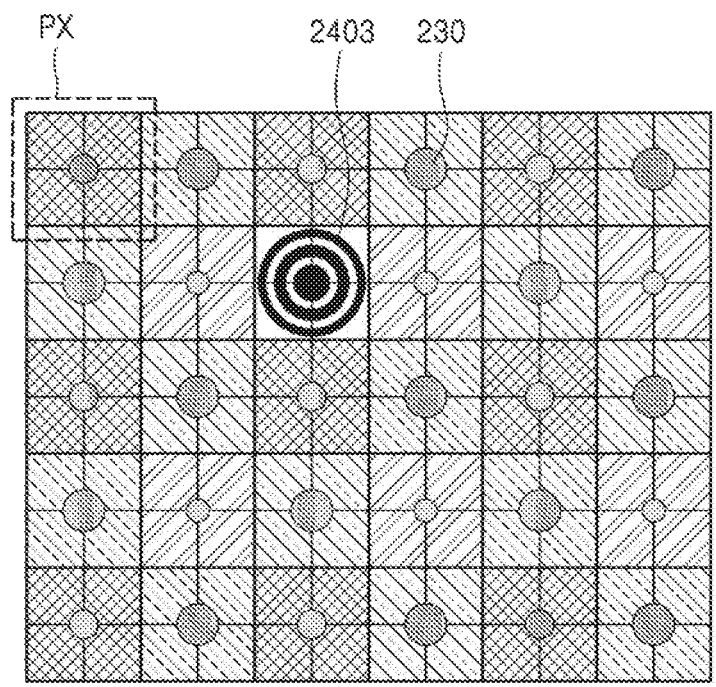
FIG. 15 illustrates an example in which a focusing element is provided in a pixel of an image sensor according to an example embodiment.

Referring to FIG. 15, a focusing element 2403 may be provided in a region corresponding to one pixel PX. In addition, the color separation element 230 may be provided in a region corresponding to the other pixel PX. The focusing element 2403 may include a concentric binary lens structure.

Figure 16:
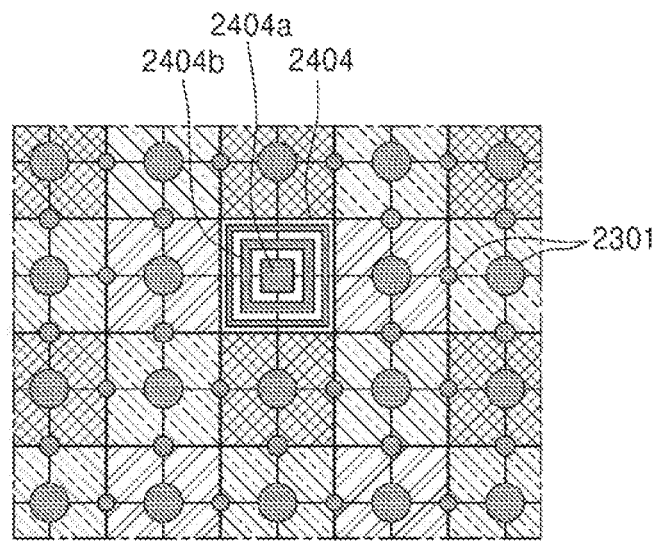
FIGS. 16, 17, 18, and 19 illustrate various examples of a focusing element of an image sensor according to an example embodiment.

FIG. 16 illustrates another example of a focusing element 2404. Referring to FIG. 16, the focusing element 2404 may include a square pillar 2404a and a concentric square band structure 2404b. The square band structure 2404b may have the same width. However, embodiments are not limited thereto. For example, the width of the square band structure 2404b may decrease from the square pillar 2404a toward the periphery. In a structure where the width decreases, an effective refractive index may be largest at the center of the focusing element 2404. The color separation element 2301 may be provided in another pixel.

Figure 17:
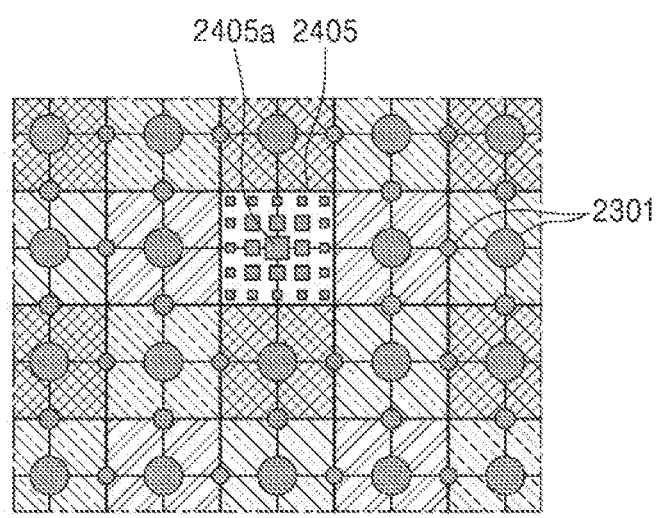

FIG. 17 illustrates another example of a focusing element 2405. Referring to FIG. 17, the focusing element 2405 may include a plurality of square pillars 2405a. The square pillars 2405a may have the same width. The width of the square pillar 2405a may decrease from the center of the focusing element 2405 toward the periphery.

Figure 18:
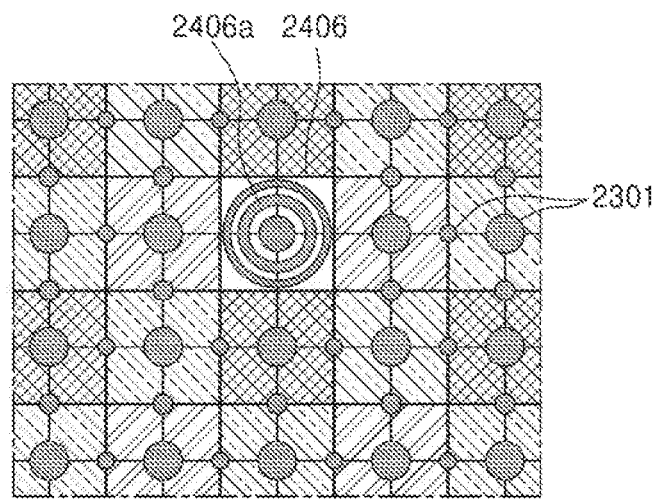

FIG. 18 illustrates another example of a focusing element 2406. Referring to FIG. 18, the focusing element 2406 may include a concentric structure 2406a. The width of the concentric structure 2406a may decrease from the center of the focusing element 2406 toward the periphery.

Figure 19:
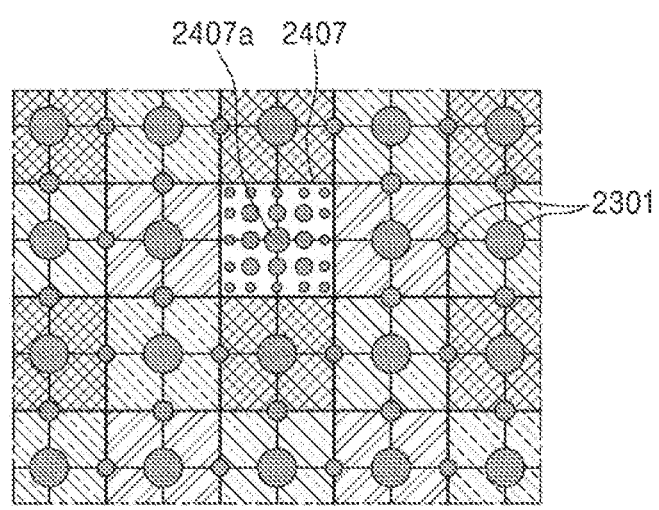

FIG. 19 illustrates another example of a focusing element 2407. Referring to FIG. 19, the focusing element 2407 may include a plurality of circular pillars 2407a. The circular pillar 2407a may have the same width. The width of the circular pillar 2407a may decrease from the center of the focusing element 2407 toward the periphery.

Figure 20:
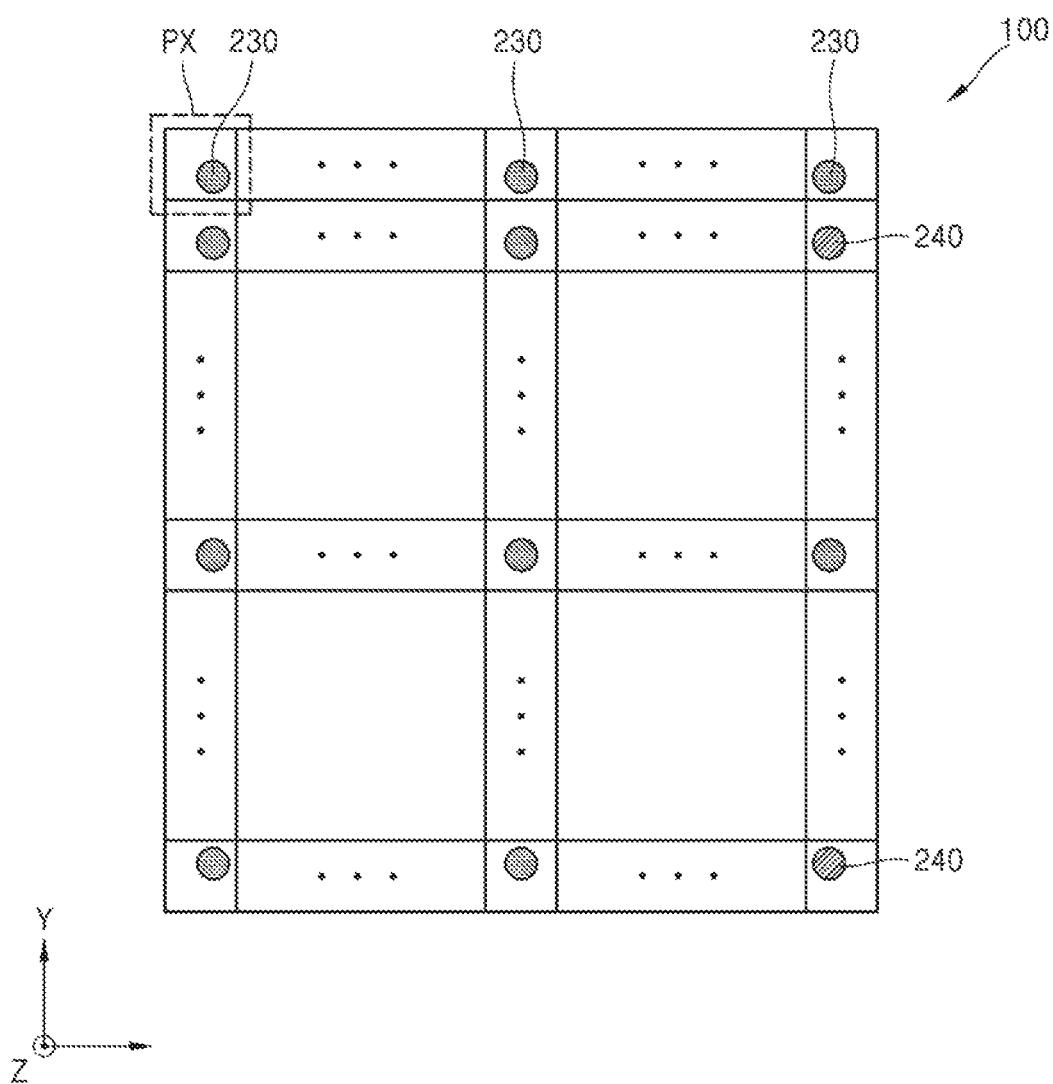
FIG. 20 illustrates a focusing element disposed at different positions in a pixel region according to various regions of an image sensor according to an example embodiment.

FIG. 20 illustrates an arrangement structure of the plurality of color separation elements 230 according to each region in the image sensor 100. Referring to FIG. 20, the color separation element 230 may be disposed at the center of the pixel PX in the center portion of the image sensor 100 and may be shifted and disposed at the center of the pixel PX in the peripheral portion of the image sensor 100. As described with reference to FIG. 1, this is because the CRA of light passing through the image sensor 100 varies according to a position where the light enters the image sensor 100 and accordingly, the color separation element 230 is shifted and disposed. In addition, the focusing element 240 may be disposed at the center of the pixel PX in the center portion of the image sensor 100 and may be shifted and disposed at the center of the pixel PX in the peripheral portion of the image sensor 100.

Figure 21:
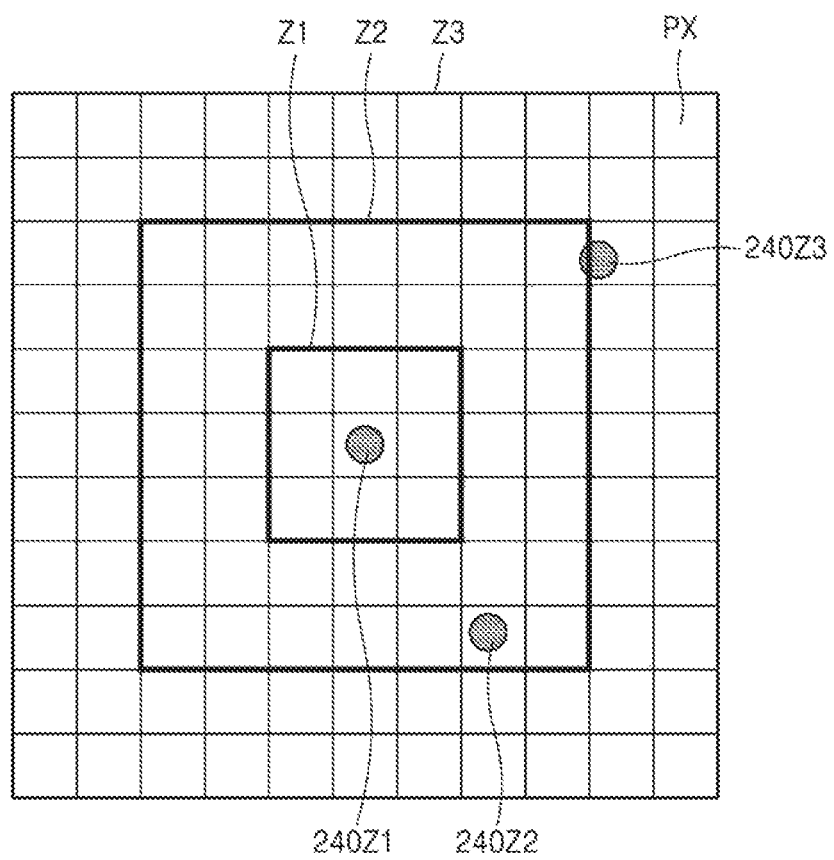
FIG. 21 illustrates an example in which an image sensor includes a plurality of zones or regions, and a focusing element is shifted and disposed in the plurality of zones or regions according to an example embodiment.

FIG. 21 illustrates an example of dividing an image sensor into a plurality of zones or regions. For example, the image sensor may include a first zone or region Z1, which is a central region, a second zone or region Z2 of the perimeter of the first zone or region Z1, and a third zone or region Z3 of the perimeter of the second zone or region Z2. For example, in the first zone or region Z1, a first focusing element 240Z1 may be disposed in the center region of the pixel PX. In the second zone or region Z2, a second focusing element 240Z2 may be shifted and disposed by a first distance from the center of the pixel PX. In the third zone or region Z3, a third focusing element 240Z3 may be shifted and disposed by a second distance from the center of the pixel PX. The first distance may be less than the second distance. However, such a configuration is just an example, and the number of zones or regions and the position of a focusing element in each zone or region may be variously configured. The zone or region of the image sensor may be divided into concentric circles or concentric square shapes. The zone or region may be partitioned in various ways such as vertical partitioning or horizontal partitioning.

Figure 22:
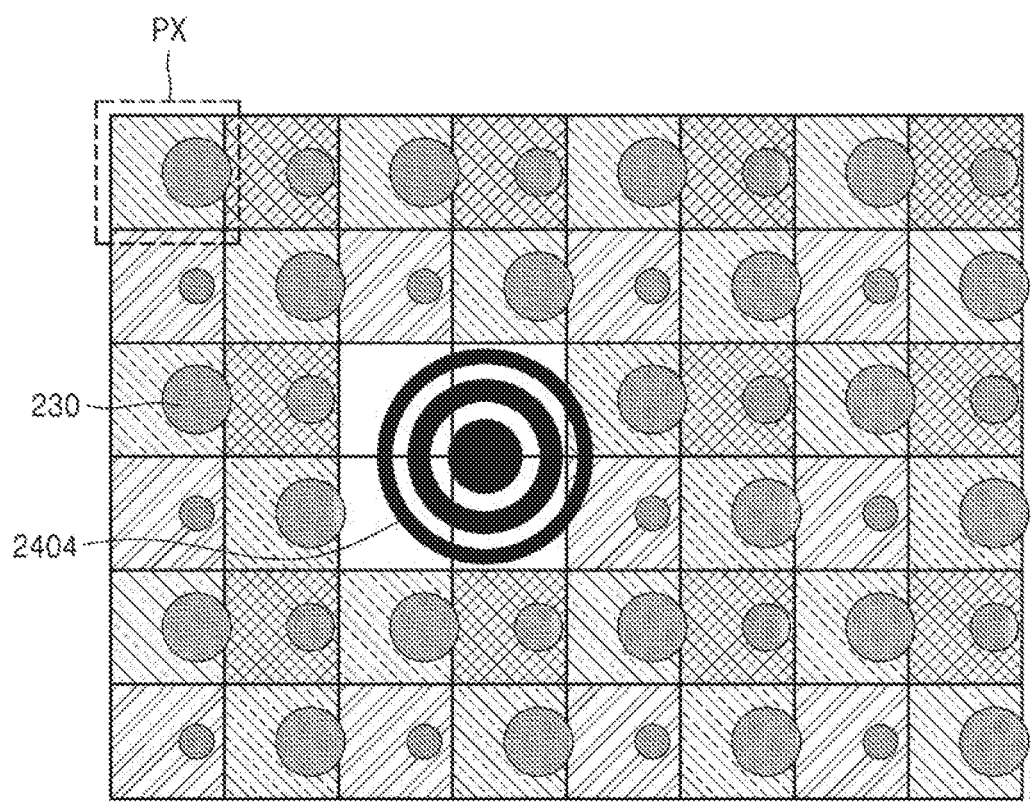
FIG. 22 illustrates an example in which a color separation element and a focusing element are shifted and disposed in a pixel region of an image sensor according to an example embodiment.

FIG. 22 illustrates an example in which the color separation element 230 and the focusing element 2404 are shifted and disposed with respect to the pixel PX. The focusing element 2404 may be shifted to correspond to the shift direction and the shift distance of the color separation element 230.

FIG. 23A to 23C are diagrams for explaining a phase detection auto focusing (PDAF) method.

Light from an object may be incident on an image sensor through an objective lens. In a focusing element of the image sensor, two focusing images of image-A and image-B may be detected. A phase difference between the two focusing images may be detected. FIG. 23A illustrates an example where the objective lens is located farther than a focal length with respect to the image sensor. In this case, the objective lens may be moved closer to the image sensor to focus. FIG. 23B illustrates an example where the objective lens is located at the focal length. FIG. 23C illustrates an example where the objective lens is located closer than the focal length with respect to the image sensor. In this case, the objective lens may be moved far away from the image sensor to focus light. As described above, the image quality of the image sensor may be improved through PDAF.

Figure 24:
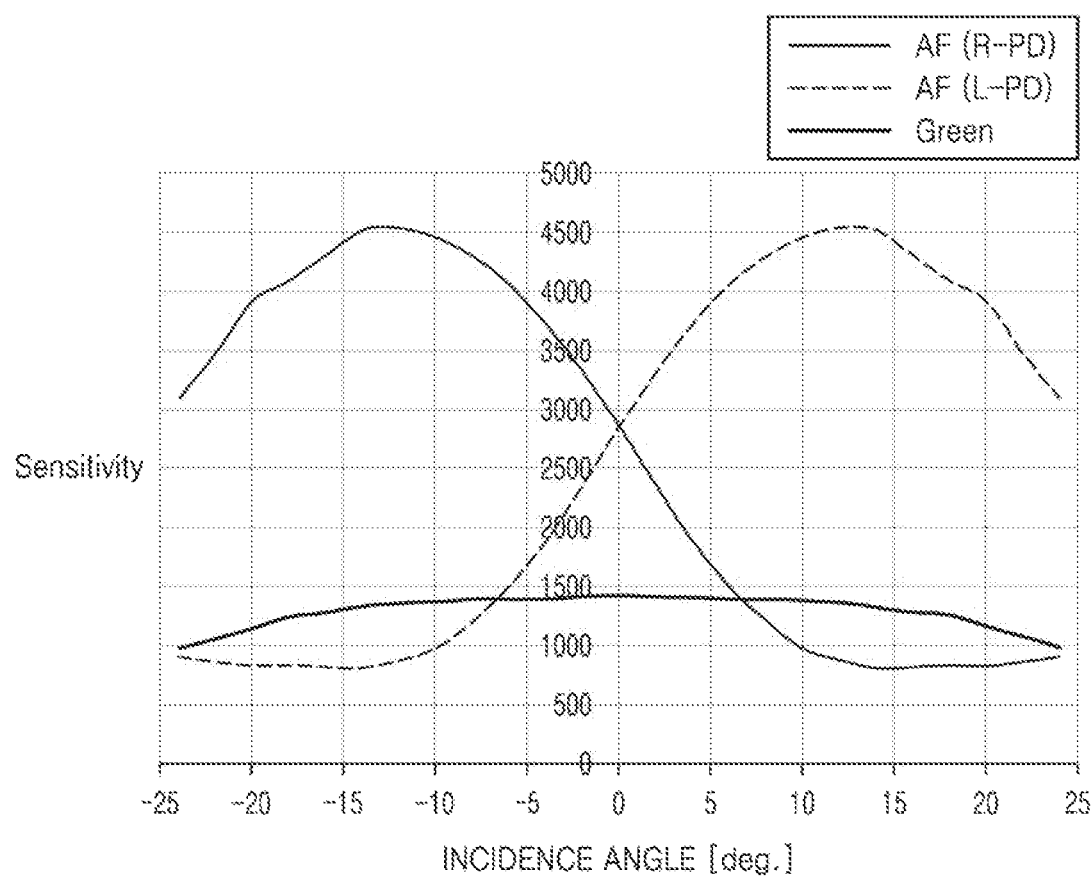
FIG. 24 illustrates a change in the sensitivity of a focusing element according to an incidence angle of an image sensor according to an example embodiment.

FIG. 24 illustrates sensitivity of a focusing element according to an incidence angle of light with respect to an image sensor. The sensitivity of the focusing element may be measured by the contrast ratio of a right light sensor R-PD and a left light sensor L-PD. For example, in the structure shown in FIG. 10, the contrast ratio at the incidence angle of 10 degrees is about 4.5, which is higher than the contrast ratio of about 2.7 when focusing is performed using an existing micro lens. This may indicate that the AF performance of the focusing element is improved.

Figure 25:
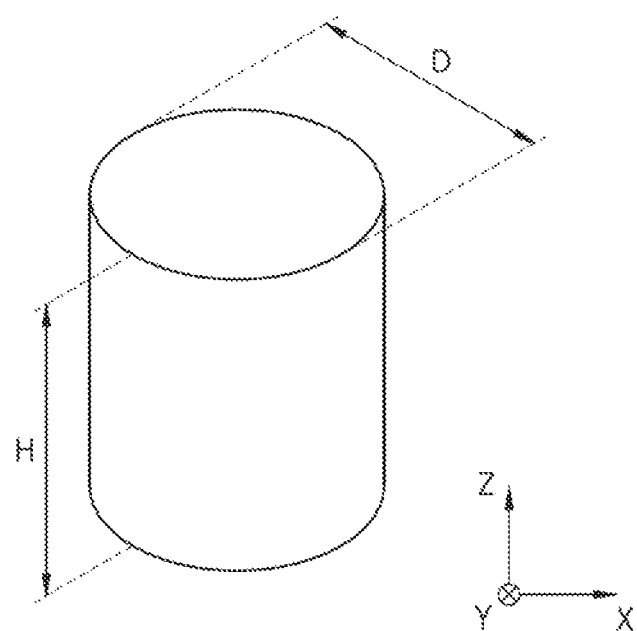
FIG. 25 is a diagram illustrating an example of a cylindrical nanostructure employed in a color separation element and a focusing element of an image sensor according to an example embodiment.

FIG. 25 is a perspective view illustrating an exemplary shape of a nanostructure that may be employed in a color separation element and a focusing element of an image sensor according to an example embodiment. Referring to FIG. 25, the nanostructure may have a cylindrical shape having a diameter D and a height H. At least one of the diameter D and the height H may be a sub-wavelength. The diameter D may vary depending on a position where the nanostructure is disposed.

In addition, the nanostructure may be formed as a pillar having various cross-sectional shapes. FIGS. 26A to 26H are plan views showing exemplary shapes of nanostructures that may be employed in a color separation element and a focusing element of an image sensor.

Figure 26A:
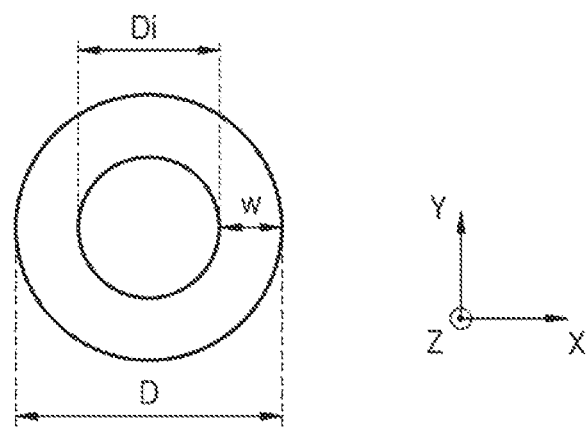
FIGS. 26A, 26B, 26C, 26D, 26E, 26F, 26G, and 26H illustrate examples of a nanostructure employed in a color separation element and a focusing element of an image sensor according to an embodiment.

As shown in FIG. 26A, the cross-sectional shape of the nanostructure may have a circular ring shape having the outer diameter D and an inner diameter Di. A width w of the ring may be a sub-wavelength.

Figure 26B:
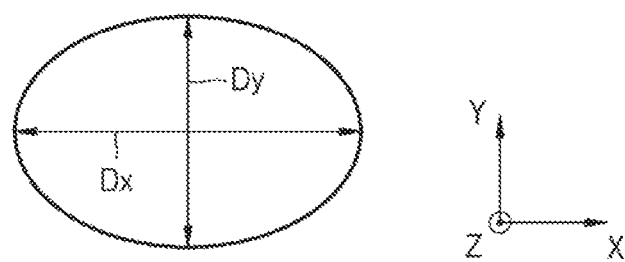
Figure 26C:
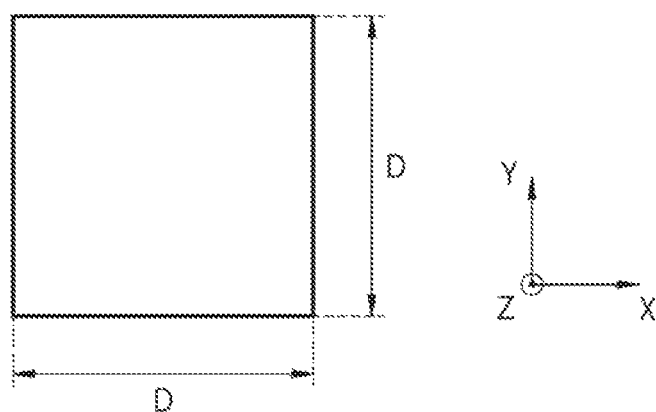
Figure 26D:
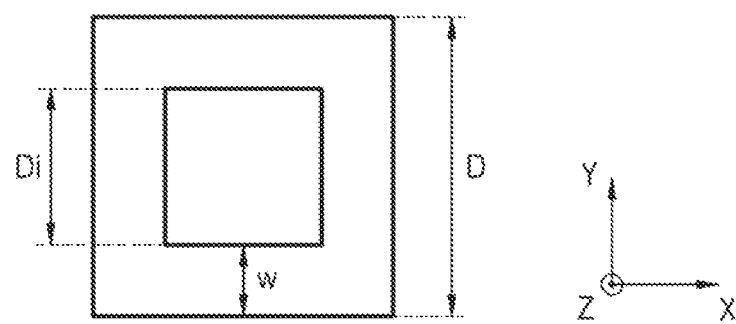

As shown in FIG. 26B, the cross-sectional shape of the nanostructure may have an oval shape in which the major axis and minor axis lengths in the first direction (X direction) and the second direction (Y direction) are respectively denoted by Dx and Dy. As shown in FIGS. 26C, 26D, and 26F, the cross-sectional shape of the nanostructure may be a square shape, a square ring shape, or a cross shape.

Figure 26E:
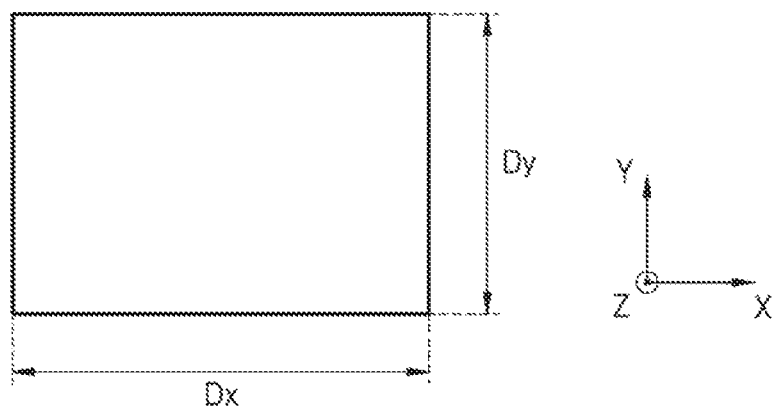
Figure 26F:
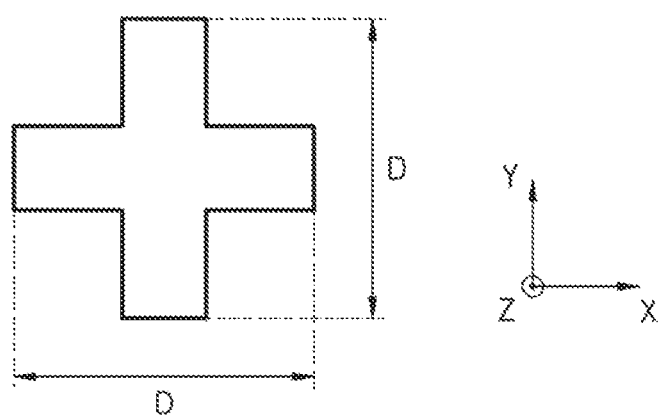
Figure 26G:
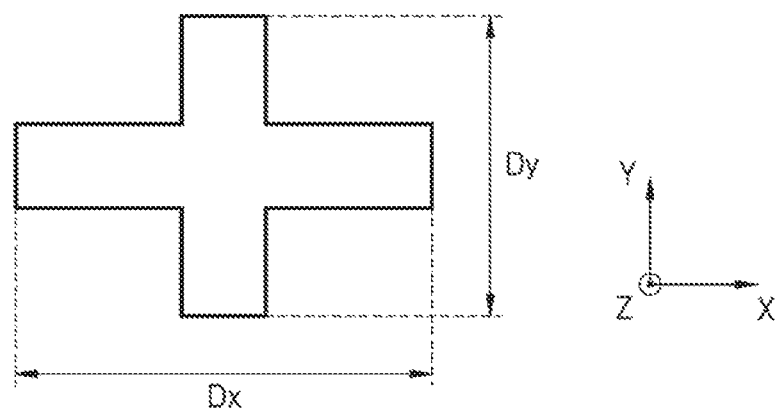

As shown in FIGS. 26E and 26G, the cross-sectional shape of the nanostructure may have a rectangular shape or a cross shape in which the lengths Dx and Dy of the first direction (X direction) and the second direction (Y direction) are different from each other.

Figure 26H:
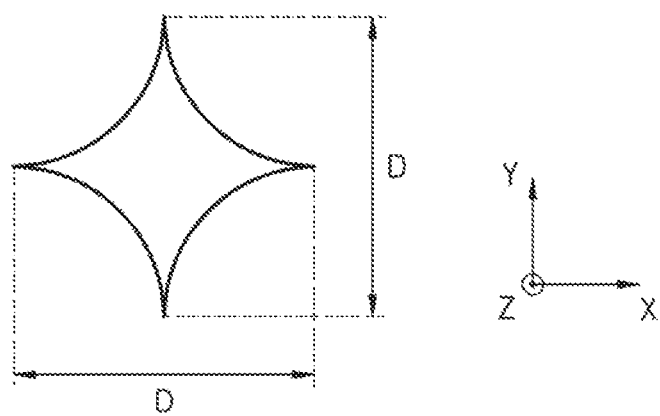

In addition, as shown in FIG. 26H, the cross-sectional shape of the nanostructure may be a shape having a plurality of concave arcs.

The image sensor according to the above-described example embodiments may be employed in various optical devices such as a camera or electronic devices. Such electronic devices may be, for example, a smart phone, a mobile phone, a portable phone, a personal digital assistant (PDA), a laptop, a PC, various portable devices, and other mobile or non-mobile computing devices, but is not limited thereto.

Figure 27:
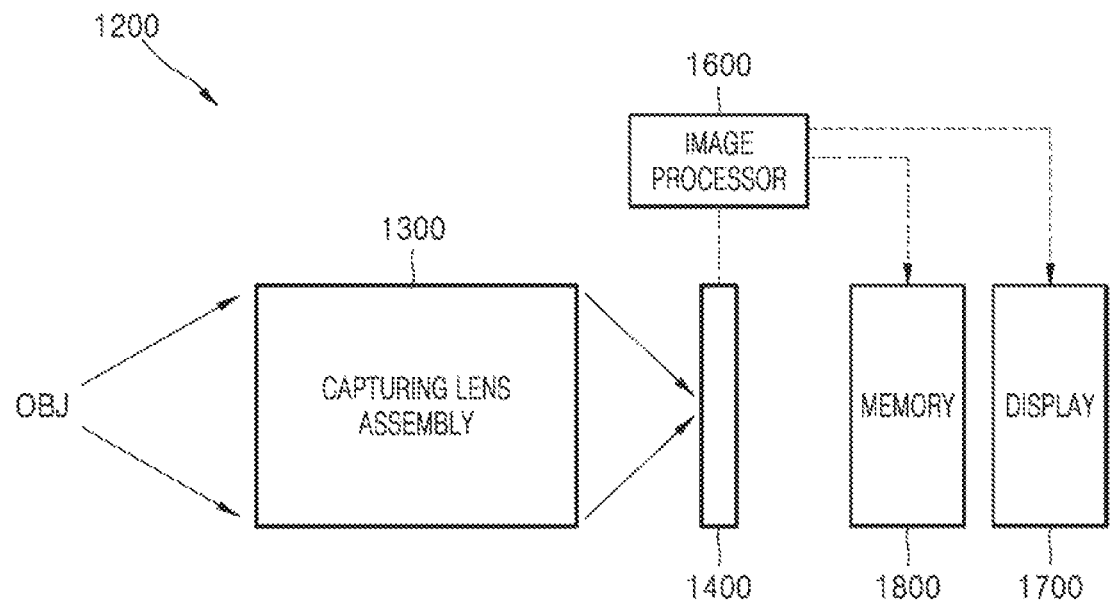
FIG. 27 is a block diagram of an electronic device according to an example embodiment.

FIG. 27 is a block diagram illustrating a schematic configuration of an electronic device 1200 according to an example embodiment.

The electronic device 1200 may include a capturing lens assembly 1300 that collects light reflected from an object OBJ to form an optical image and an image sensor 1400 that converts the optical image formed by the capturing lens assembly 1300 into an electrical signal. An infrared ray block filter may be further disposed between the image sensor 1400 and the capturing lens assembly 1300.

As the image sensor 1400, an image sensor described with reference to FIGS. 1 to 26 may be employed. The electronic device 1200 may also include an image processor 1600 that processes the electrical signal of the image sensor 1400 into an image signal. The image processor 1600 may perform operations such as noise removal and color interpolation on signals for each color sensed by the image sensor 1400 to form an image. The electronic device 1200 may further include a display 1700 that displays the image formed by the image processor 1600 and a memory 1800 that stores image data formed by the image processor 1600. As described above, the image sensor 1400 may include a focusing element in a region corresponding to at least one pixel and perform AF to obtain a higher quality image. In addition, the focusing element of the image sensor according to various example embodiments may include a nanostructure to achieve easy manufacturing and increase productivity. In addition, a color separation element and the focusing element may be provided in the same layer to simplify a manufacturing process.

Figure 28:
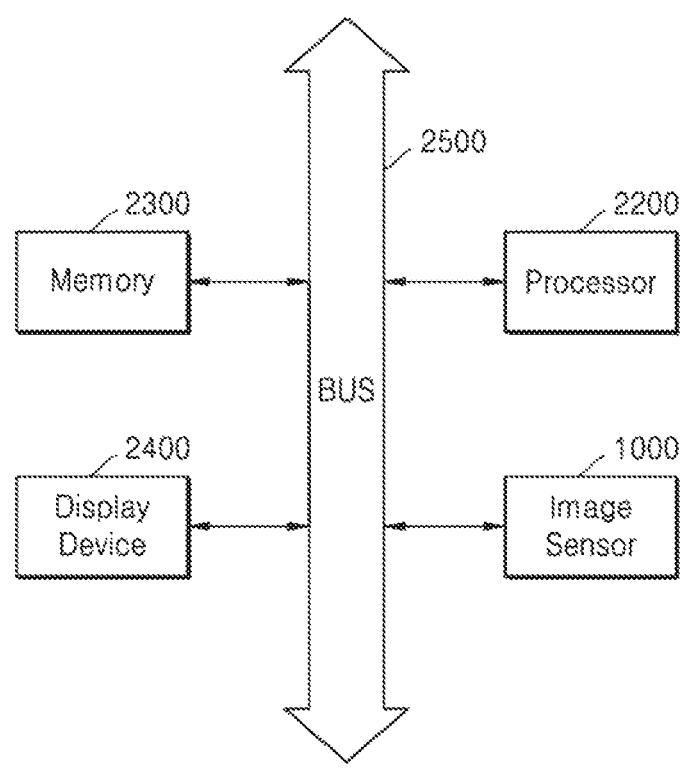
FIG. 28 is a schematic block diagram of an electronic device including an image sensor according to example embodiments.

FIG. 28 is a schematic block diagram of an electronic device including an image sensor according to example embodiments. The electronic device may include an image sensor 1000, a processor 2200, a memory 2300, a display 2400, and a bus 2500. The image sensor 1000 may obtain image information about an external object under control of the processor 2200 and provide the image information to the processor 2200. The processor 2200 may store the image information provided from the image sensor 1000 in the memory 2300 through the bus 2500. The processor 2200 may output the image information stored in the memory 2300 to the display 2400 and display the image information to a user. Also, as described above, the processor 2200 may perform various image processing on the image information provided from the image sensor 1000.

FIGS. 29 to 39 illustrate examples of various multimedia devices that are electronic devices to which image sensors are applied according to example embodiments.

The image sensors according to example embodiments may be applied to various multimedia devices having an image capturing function. For example, the image sensor may be applied to a camera 2000 as shown in FIG. 28. The camera 2000 may be a digital camera or a digital camcorder.

Figure 29:
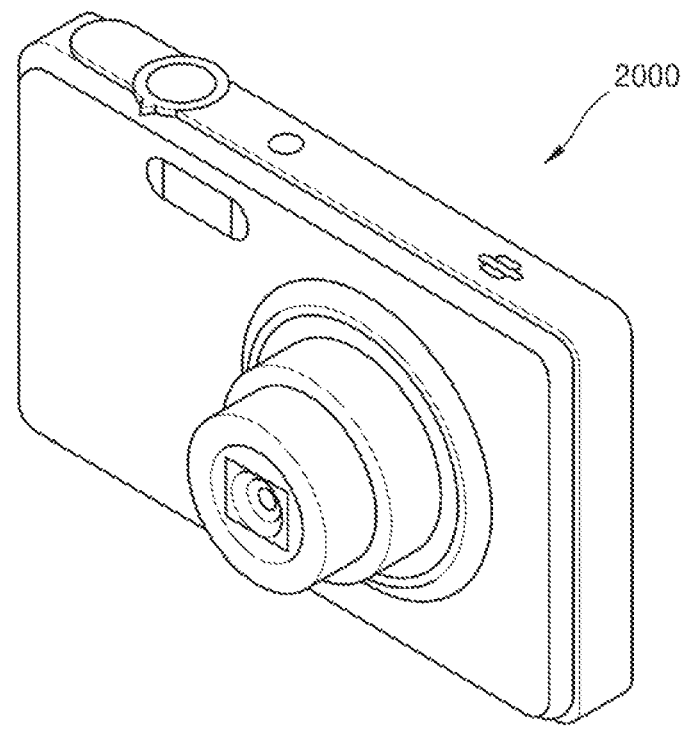
FIGS. 29, 30, 31, 32, 33, 34, 35, 36, 37, 38, and 39 illustrate examples of electronic devices to which image sensors are applied according to example embodiments.
Figure 30:
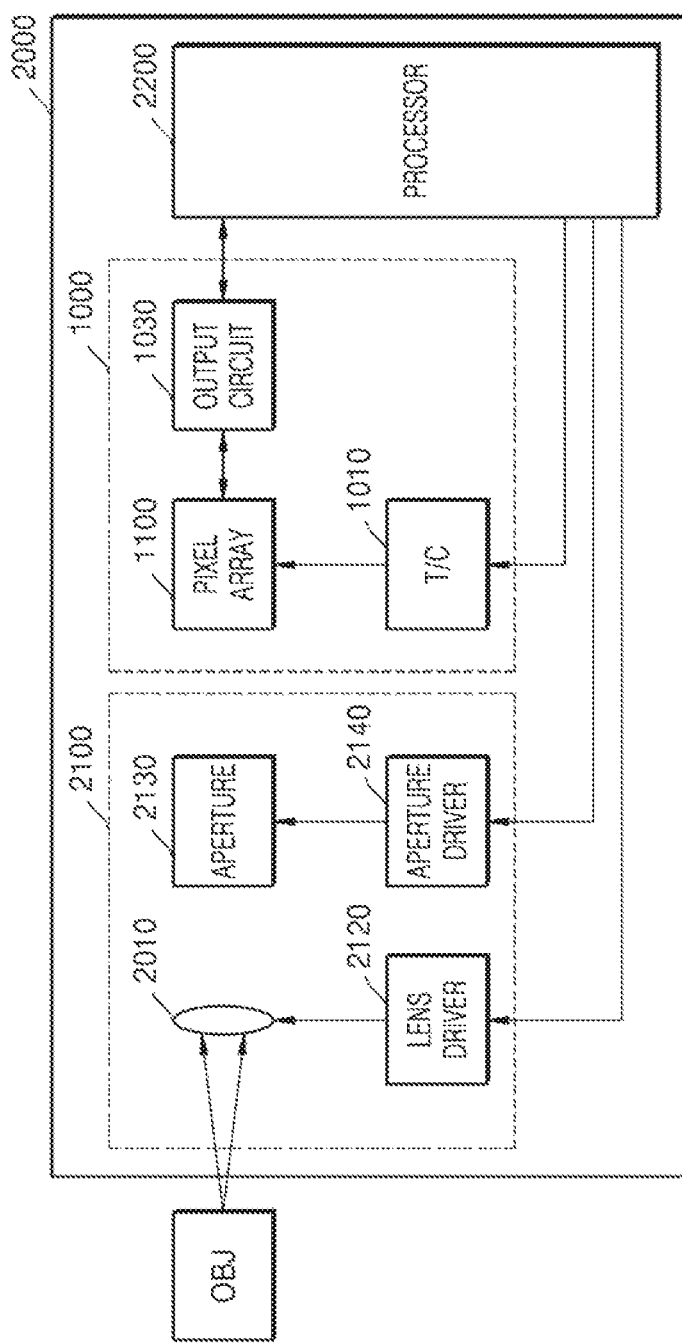

Referring to FIG. 29, the camera 2000 may include an imaging assembly 2100, the image sensor 1000, and the processor 2200.

The imaging assembly 2100 may form an optical image by focusing light reflected from an object OBJ. The imaging assembly 2100 may include an objective lens 2010, a lens driver 2120, an aperture 2130, and an aperture driver 2140. Although only one lens element is representatively shown in FIG. 30 for convenience, the objective lens 2010 may include a plurality of lens elements of different sizes and shapes. The lens driver 2120 may communicate information about focus detection with the processor 2200 and may adjust the position of an objective lens 2010 according to a control signal provided from the processor 2200. The lens driver 2120 may move the objective lens 2010 to adjust the distance between the objective lens 2010 and the object OBJ or adjust the positions of individual lens elements included in the objective lens 2010. The lens driver 2120 may drive the objective lens 2010 to adjust the focus on the subject OBJ. The camera 2000 may have an auto focus function.

In addition, the aperture driver 2140 may communicate information about an amount of light with the processor 2200 and may adjust the aperture 2130 according to a control signal provided from the processor 2200. For example, the aperture driver 2140 may increase or decrease the caliber of the aperture 2130 according to the amount of light entering the camera 2000 through the objective lens 2010, and may adjust the opening time of the aperture 2130.

The image sensor 1000 may generate an electrical image signal based on the intensity of incident light. The image sensor 1000 may include the pixel array 1100, the timing controller 1010, and the output circuit 1030. The image sensor 1000 may further include a row decoder shown in FIG. 1. Light transmitted through the objective lens 2010 and the aperture 2130 may form an image of the object OBJ on a light-receiving surface of the pixel array 1100. The pixel array 1100 may be a CCD or CMOS that converts an optical signal into an electrical signal. The pixel array 1100 may include additional pixels performing an auto-focusing function or a distance measurement function. In addition, the pixel array 1100 may include the above-described color separation lens array.

The processor 2200 may control the overall operation of the camera 2000 and may have an image processing function. For example, the processor 2200 may provide a control signal for the operation of each component to the lens driver 2120, the aperture driver 2140, and the timing controller 1010.

Figure 31:
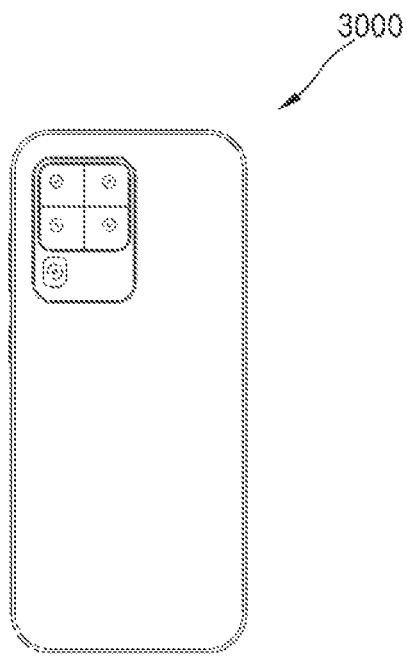
Figure 32:
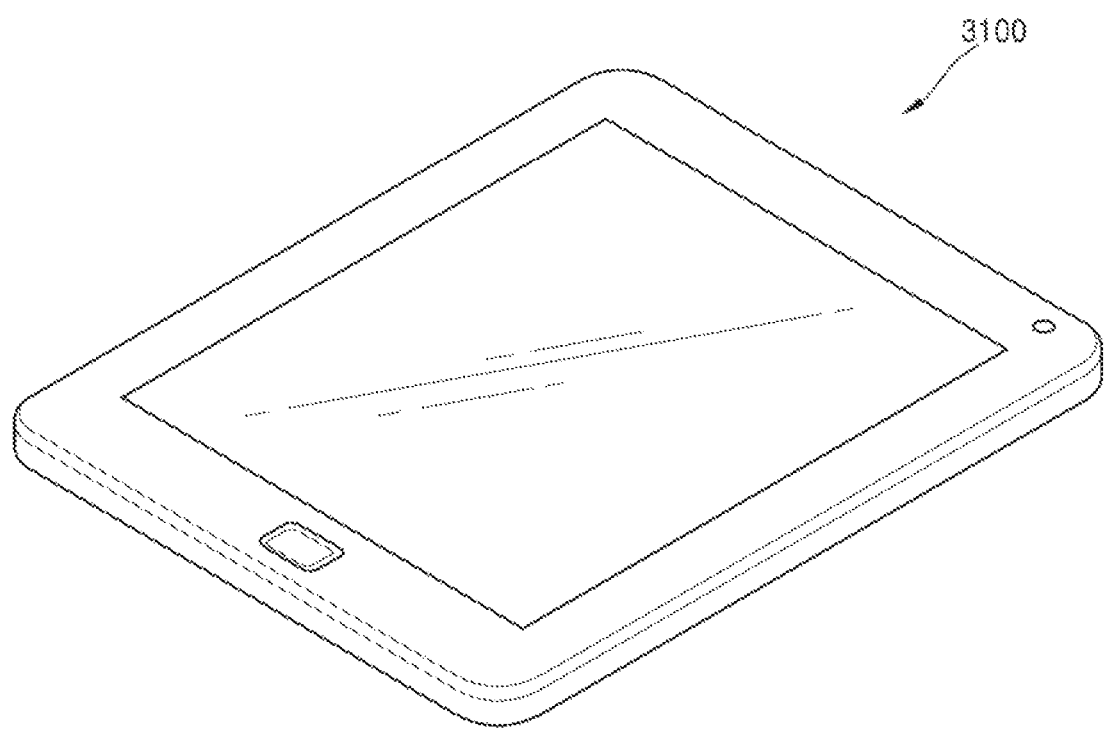
Figure 33:
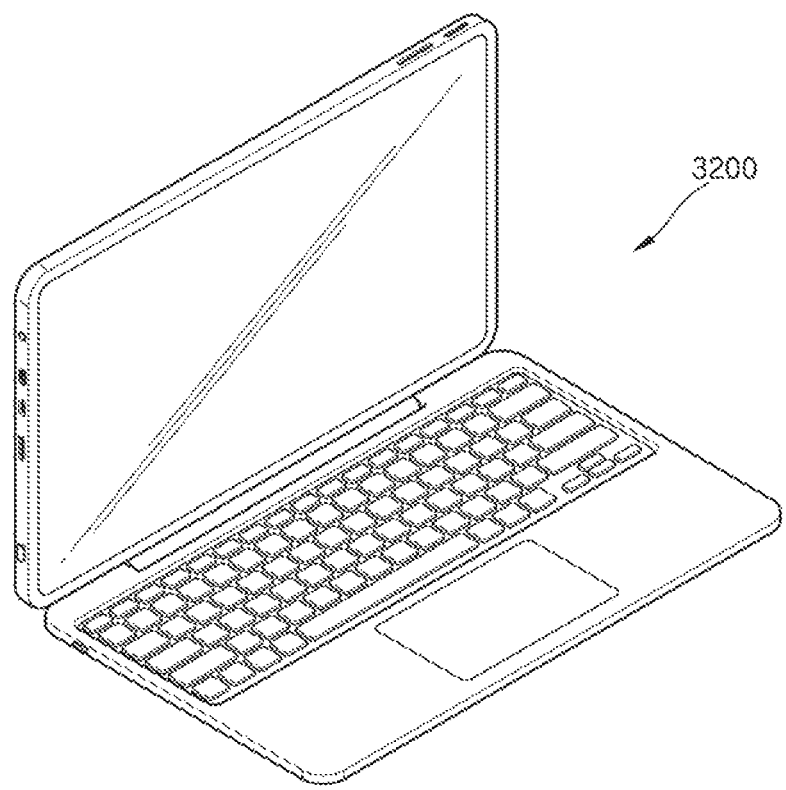
Figure 34:
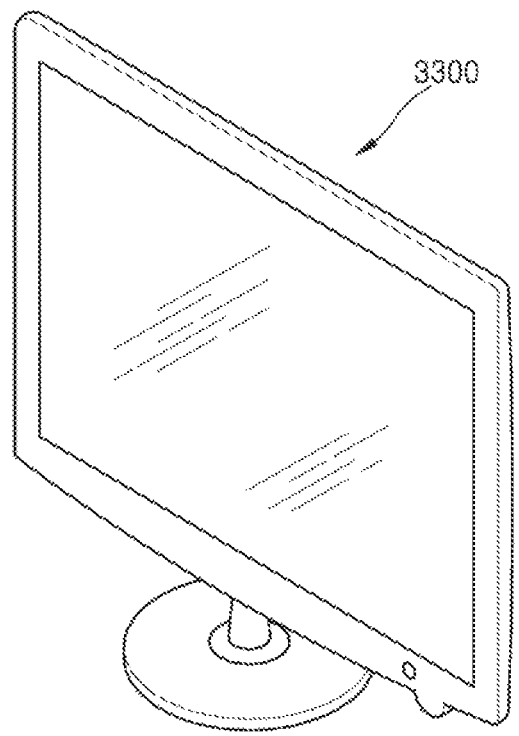

In addition, the image sensor according to the example embodiments may be applied to a mobile phone or a smart phone 3000 as shown in FIG. 31, and may be applied to a tablet or a smart tablet 3100 as shown in FIG. 32. In addition, the image sensor according to the example embodiments may be applied to a notebook computer 3200 as shown in FIG. 33 and may be applied to a television or a smart television 3300 as shown in FIG. 34.

For example, the smart phone 3000 or the smart tablet 3100 may include a plurality of high-resolution cameras each equipped with a high-resolution image sensor. The high-resolution cameras may be used to extract depth information of subjects in an image, adjust out-focusing of the image, or automatically identify objects in the image.

Figure 35:
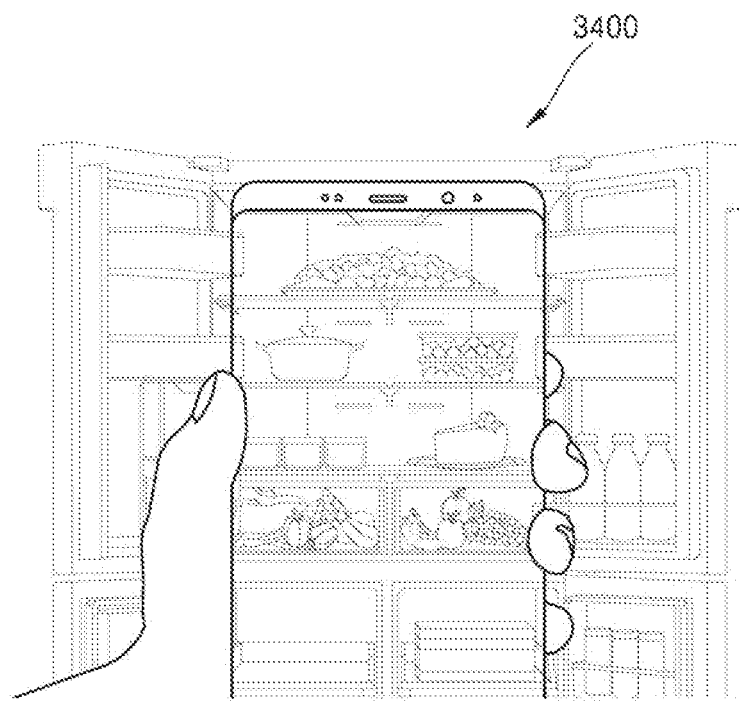
Figure 36:
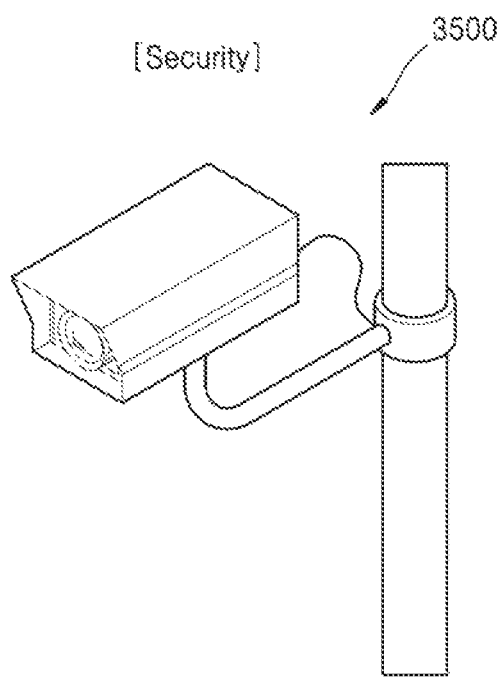
Figure 37:
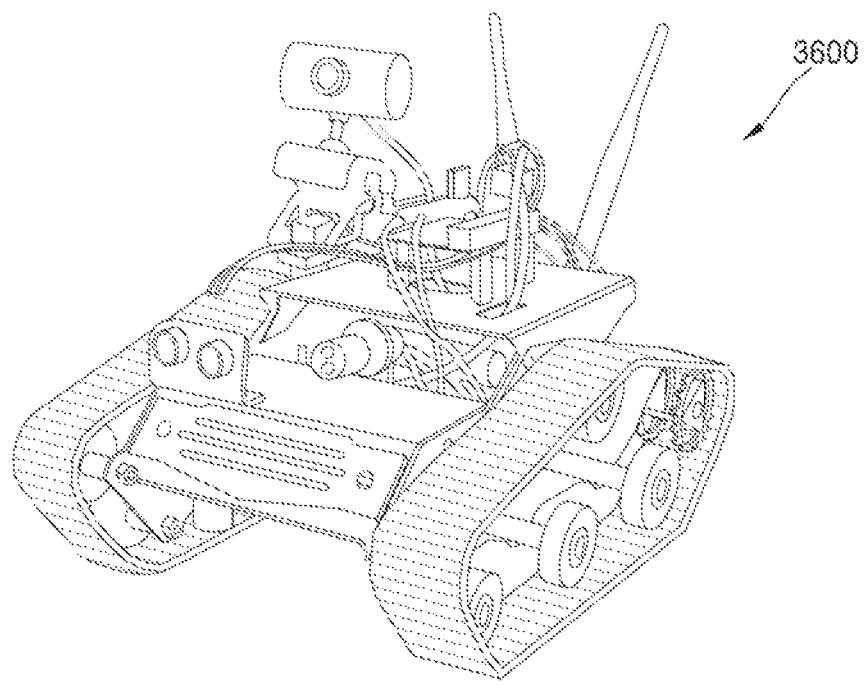
Figure 38:
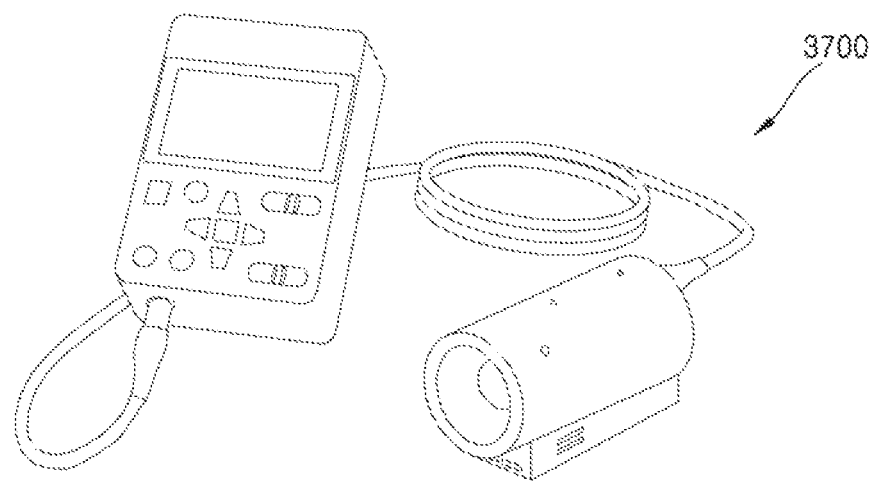

In addition, the image sensor may be applied to a smart refrigerator 3400 shown in FIG. 35, a security camera 3500 shown in FIG. 36, a robot 3600 shown in FIG. 37, a medical camera 3700 shown in FIG. 38. For example, the smart refrigerator 3400 may automatically recognize food in the refrigerator using an image sensor, and inform the user of the existence of specific food, the type of food that has been come in or released, etc., to the user through the smartphone. The security camera 3500 may provide an ultra-high resolution image and may use high sensitivity to recognize an object or person in the image even in a dark environment. The robot 3600 may be input at a disaster or industrial site that human may not directly access and may provide a high-resolution image. The medical camera 3700 can provide a high-resolution image for diagnosis or surgery, and dynamically adjust field of view.

Figure 39:
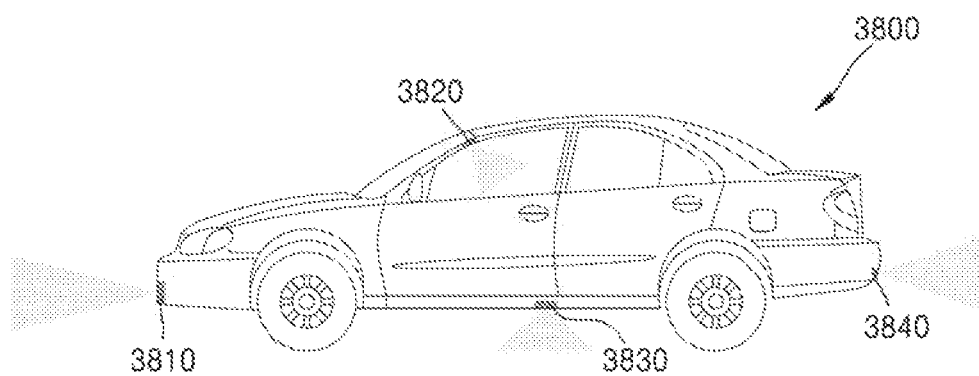

Also, the image sensor may be applied to a vehicle 3800 as shown in FIG. 39. The vehicle 3800 may include a plurality of vehicle cameras 3810, 3820, 3830, and 3840 arranged at various positions. Each of the vehicle cameras 3810, 3820, 3830, and 3840 may include an image sensor according to an example embodiment. The vehicle 3800 may provide a variety of information about the interior or surroundings of the vehicle 3800 to a driver by using the plurality of vehicle cameras 3810, 3820, 3830, and 3840, and automatically recognize objects or people in the image to provide information necessary for autonomous driving.

The image sensor according an example embodiment may include a focusing element of a nanostructure to perform auto-focusing. The image quality of the image sensor may be improved by auto-focusing. The focusing element may have the nanostructure, and thus, the manufacturing process may be more simplified.

An electronic device including the image sensor may provide a higher quality image through auto-focusing.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. An image sensor comprising:
   a light sensor array comprising a plurality of light sensors configured to detect an incident light and convert the incident light into an electrical signal, the plurality of light sensors being provided in a plurality of pixels;
   a spacer layer provided on the light sensor array;
   a color separation element provided on the spacer layer and configured to separate the incident light into light of a plurality of colors based on a wavelength band and transmit the separated light of the plurality of colors to a corresponding one of the plurality of pixels; and
   a focusing element provided on the spacer layer, and comprising a nanostructure in a region corresponding to at least one pixel among the plurality of pixels and configured to perform auto focusing to adjust a focus of the image sensor.

2. The image sensor of claim 1, wherein the focusing element and the color separation element arei-s provided on a same surface of the spacer layer color separation element.

3. The image sensor of claim 1, wherein an upper surface of the focusing element and an upper surface of the color separation element are on a same flat plane.

4. The image sensor of claim 1, wherein the focusing element comprises a binary lens structure, and wherein the binary lens structure comprises a first element having a circle shape, and a second element that surrounds the first element and has a circular ring shape.

5. The image sensor of claim 1, wherein the nanostructure included in the focusing element is provided in concentric circular ringscircic5.

6. The image sensor of claim 1, wherein the nanostructure of the focusing element has a shape dimension of a sub wavelength of the incident light.

7. The image sensor of claim 1, wherein the focusing element is provided in a 2×2 pixel and the 2×2 pixel and comprises a region corresponding to a red pixel, a blue pixel, a first green pixel, and a second green pixel, and wherein a focusing image is extracted at a position corresponding to the first green pixel and the second green pixel.

8. The image sensor of claim 1, wherein the color separation element comprises the nanostructure having a shape dimension of a sub wavelength of the light.

9. The image sensor of claim 1, wherein the image sensor comprises a plurality of regions configured to receive the incident light having different incidence angles, and a position of the focusing element provided in a corresponding pixel is different based on the plurality of regions.

10. The image sensor of claim 9, wherein the plurality of regions comprises a center region of the image sensor and a peripheral region of the image sensor, the focusing element is provided at a center of the corresponding pixel in the center region, and the focusing element is shifted and provided at the center of the corresponding pixel in the peripheral region.

11. The image sensor of claim 1, wherein the color separation element comprises a first nanostructure layer and a second nanostructure layer that is provided on an upper portion of the first nanostructure layer, and the focusing element is provided on a same layer as the second nanostructure layer.

12. An electronic device comprising:
an objective lens; and
an image sensor configured to generate an image of light incident through the objective lens, wherein the image sensor comprises:

a light sensor array comprising a plurality of light sensors configured to detect the incident light and convert the incident light into an electrical signal, the plurality of light sensors being provided in a plurality of pixels;

a spacer layer provided on the light sensor array;

a color separation element provided on the spacer layer and configured to separate the incident light into light of a plurality of colors based on a wavelength band and transmit the separated light of the plurality of colors to a corresponding one of the plurality of pixels; and a focusing element provided on the spacer layer, and comprising a nanostructure in a region corresponding to at least one pixel among the plurality of pixels and configured to perform auto focusing to adjust a position of the objective lens.

13. The electronic device of claim 12, wherein the focusing element and the color separation element areis provided on a same surface of the spacer layerlaycr as the color separation element.

14. The electronic device of claim 12, wherein an upper surface of the focusing element and an upper surface of the color separation element are on a same flat plane.

15. The electronic device of claim 12, wherein the focusing element comprises a binary lens structure.

16. The electronic device of claim 12, wherein the nanostructure of the focusing element is provided in concentric circular ringscircic5.

17. The electronic device of claim 12, the nanostructure of the focusing element has a shape dimension of a sub wavelength of the incident light.

18. The image sensor of claim 12, wherein the focusing element is provided in a 2×2 pixel and the 2×2 pixel and comprises a region corresponding to a red pixel, a blue pixel, a first green pixel, and a second green pixel, and wherein a focusing image is extracted at a position corresponding to the first green pixel and the second green pixel.

19. The image sensor of claim 12, wherein the image sensor comprises a plurality of regions configured to receive the incident light having different incidence angles, and a position of the focusing element provided in a corresponding pixel is different based on the plurality of regions.

20. The image sensor of claim 19, wherein the plurality of regions comprise a center region of the image sensor and a peripheral region of the image sensor, and wherein the focusing element is provided at a center of the corresponding pixel in the center region, and the focusing element is shifted and provided at the center of the corresponding pixel in the peripheral region.

* * * * *